United States Patent
Chiang et al.

(10) Patent No.: US 12,328,907 B2
(45) Date of Patent: Jun. 10, 2025

(54) SEMICONDUCTOR DEVICE AND MANUFACTURING METHOD THEREOF

(71) Applicant: AUO Corporation, Hsinchu (TW)

(72) Inventors: Chia-Wei Chiang, Hsinchu (TW); Yang-Shun Fan, Hsinchu (TW); Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 443 days.

(21) Appl. No.: 17/880,688

(22) Filed: Aug. 4, 2022

(65) Prior Publication Data

US 2023/0187555 A1 Jun. 15, 2023

Related U.S. Application Data

(60) Provisional application No. 63/287,695, filed on Dec. 9, 2021.

(30) Foreign Application Priority Data

Apr. 19, 2022 (TW) ................................ 111114880

(51) Int. Cl.
*H01L 29/66* (2006.01)
*H10D 30/67* (2025.01)
*H10D 99/00* (2025.01)

(52) U.S. Cl.
CPC ..... *H10D 30/6755* (2025.01); *H10D 30/6757* (2025.01); *H10D 99/00* (2025.01)

(58) Field of Classification Search
CPC ............... H01L 29/7869; H01L 29/786; H01L 29/66969; H01L 29/66; H01L 29/78696; H01L 29/78612; H01L 29/78621; H01L 29/78648; H10D 30/6755; H10D 30/67; H10D 30/6757; H10D 30/6708; H10D 30/6715; H10D 30/6734; H10D 99/00
See application file for complete search history.

(56) References Cited

U.S. PATENT DOCUMENTS

| | | | |
|---|---|---|---|
| 9,660,060 B2 | 5/2017 | Chang et al. | |
| 9,691,905 B2* | 6/2017 | Ito | H01L 27/1225 |
| 11,205,729 B2 | 12/2021 | Kikuchi et al. | |
| 11,695,016 B2 | 7/2023 | Daitoh et al. | |

(Continued)

FOREIGN PATENT DOCUMENTS

| | | |
|---|---|---|
| CN | 110246900 | 9/2019 |
| CN | 113903752 | 1/2022 |
| TW | I567995 | 1/2017 |

*Primary Examiner* — Nikolay K Yushin
(74) *Attorney, Agent, or Firm* — JCIPRNET

(57) ABSTRACT

A semiconductor device, including a substrate, a semiconductor structure, a first gate dielectric layer, a first gate, a source, and a drain, is provided. The semiconductor structure includes a first metal oxide layer and a second metal oxide layer. The second metal oxide layer covers a top surface and a sidewall of the first metal oxide layer. The second metal oxide layer has a stepped structure at the sidewall of the first metal oxide layer. A carrier mobility of the first metal oxide layer is greater than a carrier mobility of a channel region of the second metal oxide layer. A thickness of the second metal oxide layer is greater than or equal to a thickness of the first metal oxide layer. A difference between a width of the first gate and a width of the first metal oxide layer is less than 0.5 μm.

16 Claims, 22 Drawing Sheets

(56) References Cited

U.S. PATENT DOCUMENTS

| | | |
|---|---|---|
| 2009/0250693 A1 | 10/2009 | Jeong et al. |
| 2010/0006834 A1 | 1/2010 | Kim et al. |
| 2010/0140614 A1 | 6/2010 | Uchiyama et al. |
| 2015/0001534 A1 | 1/2015 | Chang et al. |
| 2015/0349133 A1 | 12/2015 | Yamazaki et al. |
| 2018/0025905 A1 | 1/2018 | Yamazaki et al. |
| 2019/0280126 A1 | 9/2019 | Kikuchi et al. |
| 2020/0124899 A1 | 4/2020 | Saitoh |
| 2021/0167223 A1 | 6/2021 | Koezuka et al. |
| 2022/0005839 A1 | 1/2022 | Daitoh et al. |
| 2022/0077318 A1 | 3/2022 | Kikuchi et al. |

\* cited by examiner

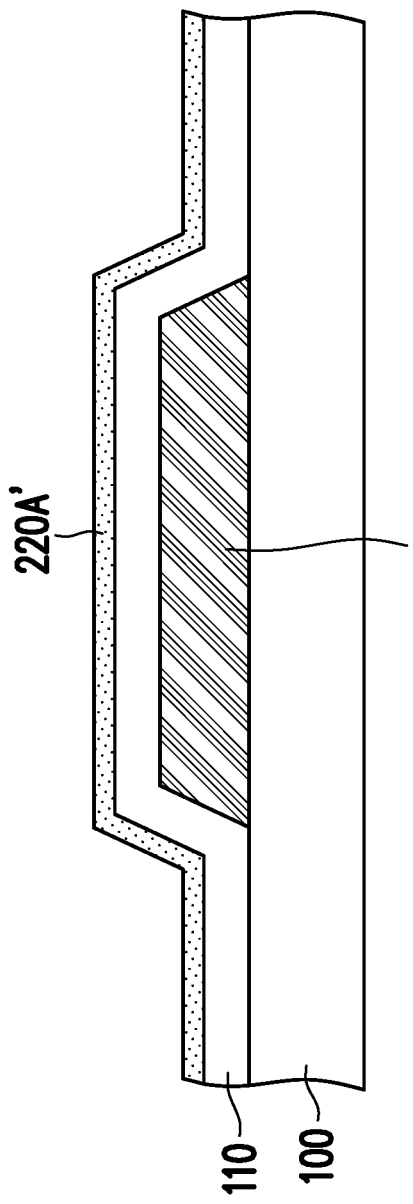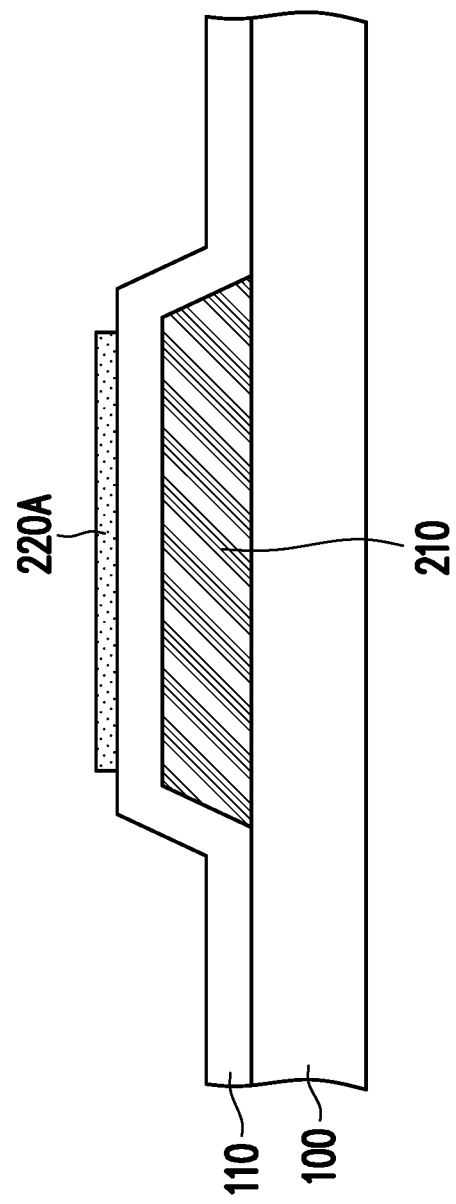

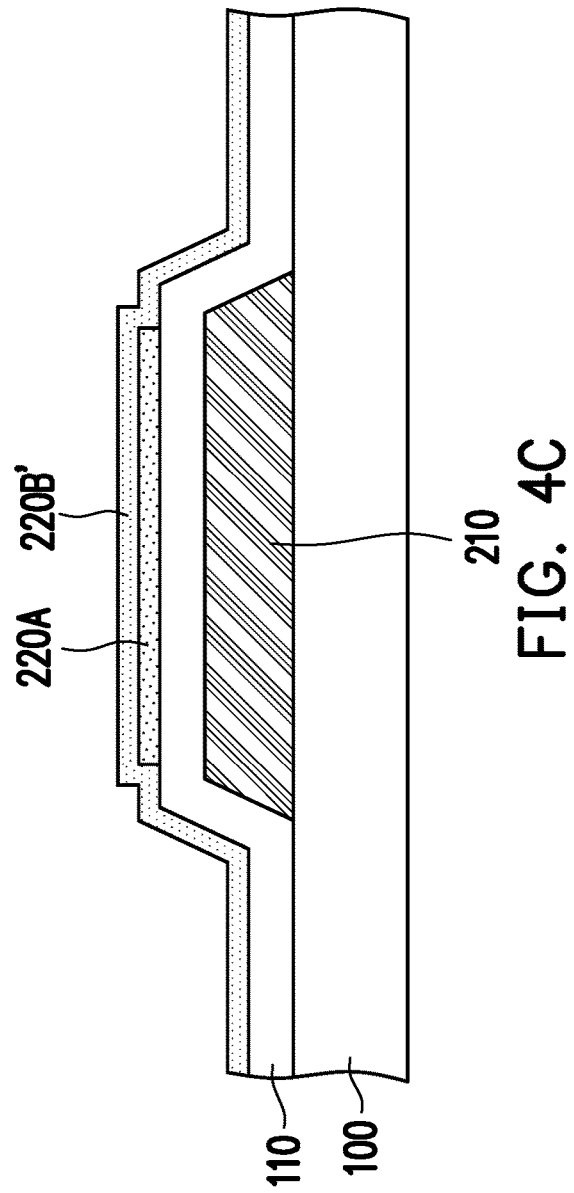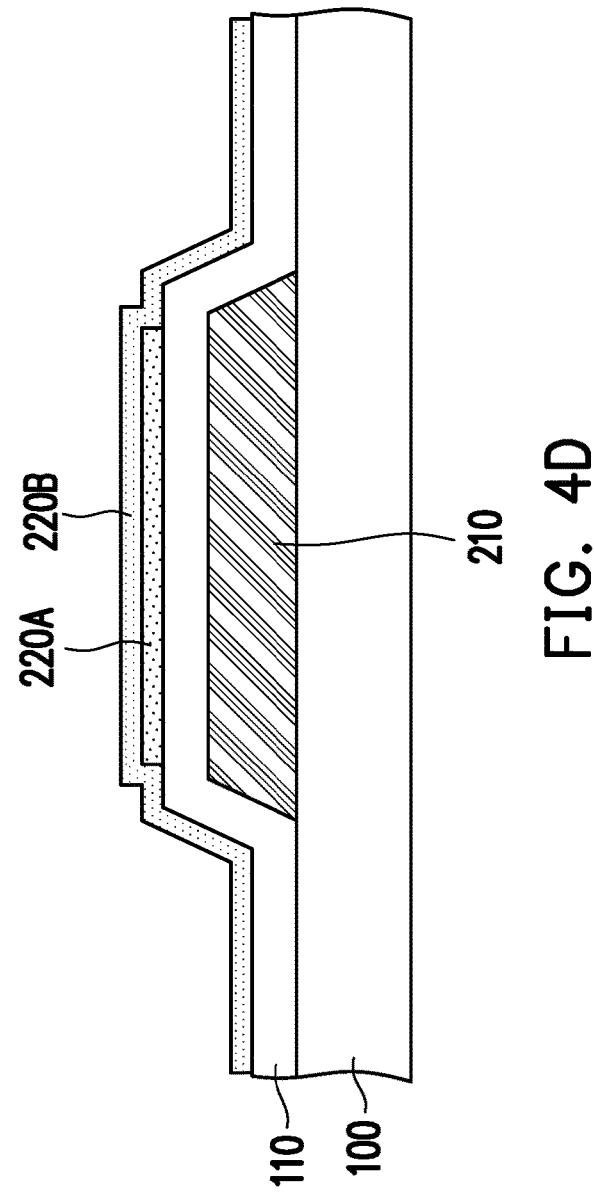

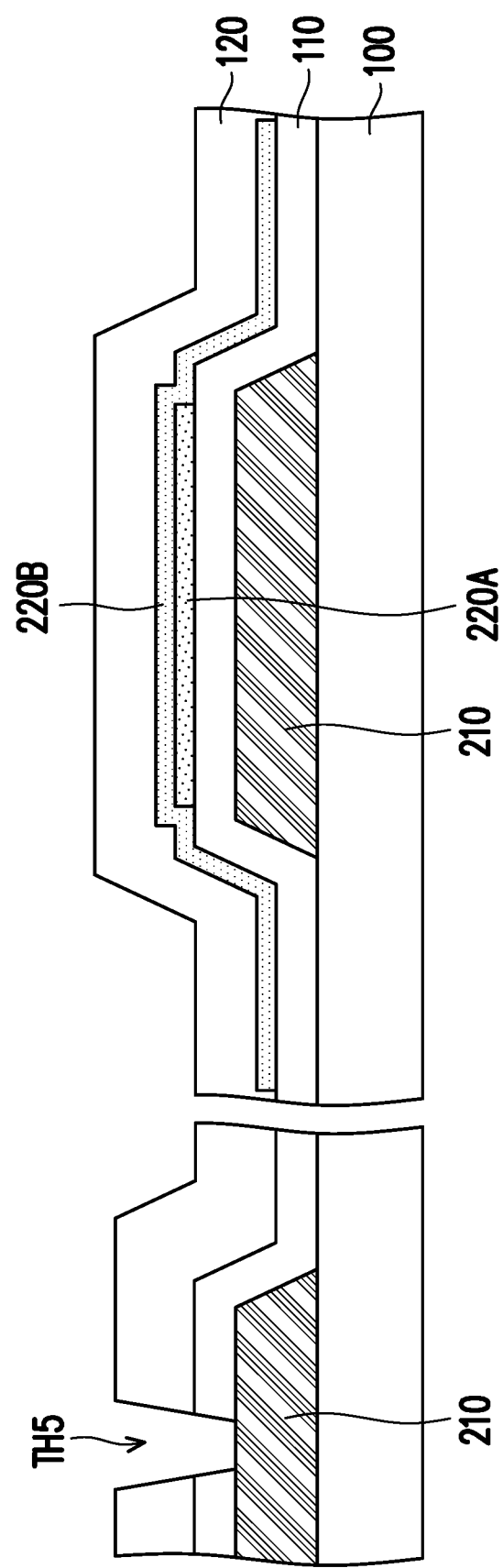

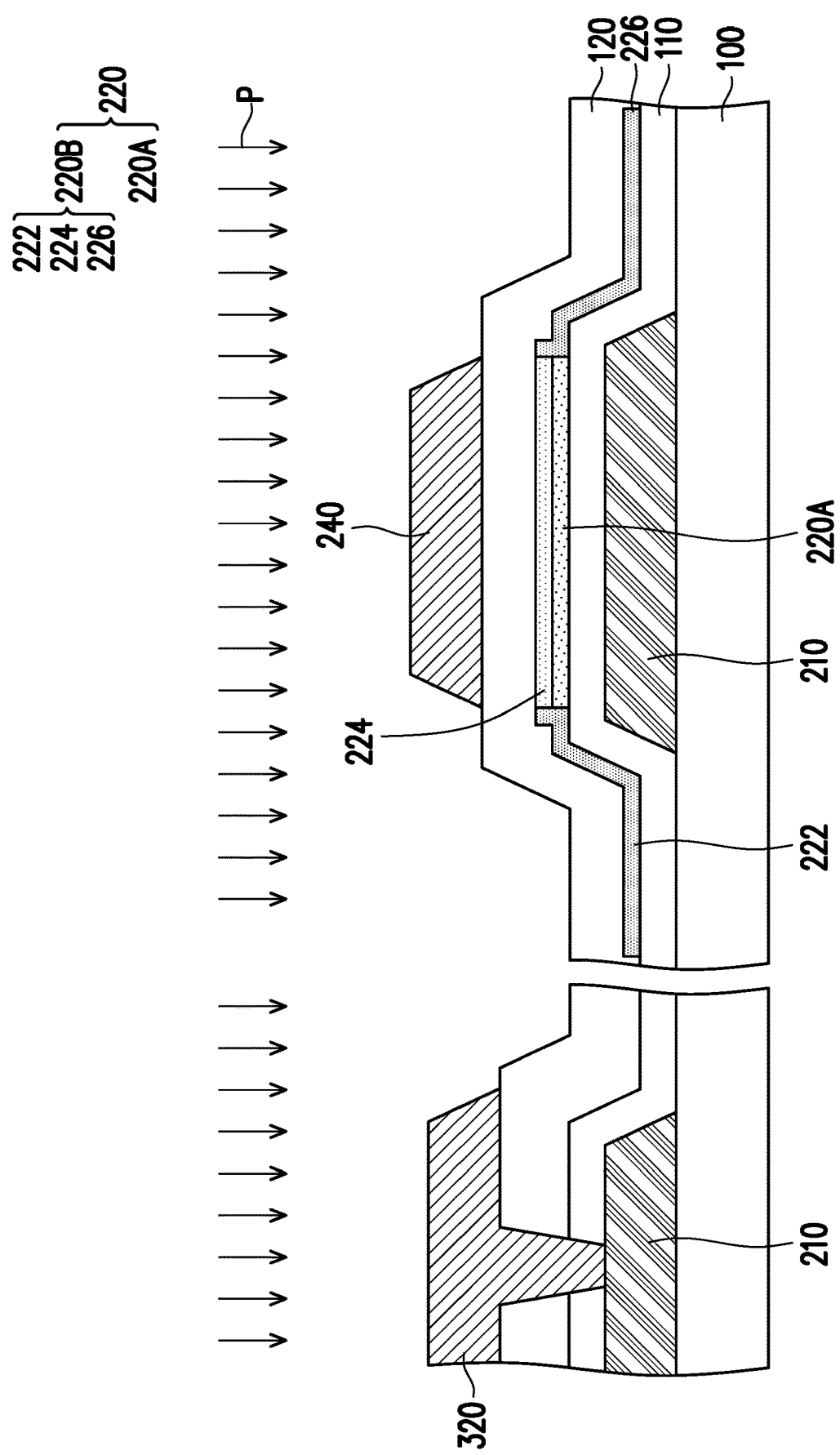

SEMICONDUCTOR DEVICE AND MANUFACTURING METHOD THEREOF

CROSS-REFERENCE TO RELATED APPLICATION

This application claims the priority benefit of U.S. Provisional Application No. 63/287,695, filed on Dec. 9, 2021 and Taiwan Application No. 111114880, filed on Apr. 19, 2022. The entirety of each of the above-mentioned patent applications is hereby incorporated by reference herein and made a part of this specification.

BACKGROUND

Technical Field

The disclosure relates to a semiconductor device and a manufacturing method thereof, and more particularly to a semiconductor device including a metal oxide layer and a manufacturing method thereof.

Description of Related Art

At present, common thin film transistors usually use amorphous silicon semiconductors as channels, and the amorphous silicon semiconductors are widely used in various thin film transistors due to simple manufacturing processes and low costs.

With the advancement of display technology, the resolution of display panels has been improving year by year. In order to shrink the thin film transistors in pixel circuits, many manufacturers are working on developing new semiconductor materials, such as metal oxide semiconductor materials. Among the metal oxide semiconductor materials, InGaZnO (IGZO) simultaneously has the advantages of small area and high electron mobility, so InGaZnO is regarded as an important new semiconductor material.

SUMMARY

The disclosure provides a semiconductor device whose semiconductor structure has the advantage of high carrier mobility and can reduce the hot carrier effect caused by an electric field of a gate.

The disclosure provides a manufacturing method of a semiconductor device, which has the advantages of high process yield and low cost.

At least one embodiment of the disclosure provides a semiconductor device. The semiconductor device includes a substrate, a semiconductor structure, a first gate dielectric layer, a first gate, a source, and a drain. The semiconductor structure is located on the substrate and includes a first metal oxide layer and a second metal oxide layer. The second metal oxide layer covers a top surface and a sidewall of the first metal oxide layer. The second metal oxide layer has a stepped structure at the sidewall of the first metal oxide layer. A carrier mobility of the first metal oxide layer is greater than a carrier mobility of a channel region of the second metal oxide layer. A thickness of the second metal oxide layer is greater than or equal to a thickness of the first metal oxide layer. The first gate dielectric layer is located on the semiconductor structure. The first gate is located on the first gate dielectric layer and overlaps with the first metal oxide layer. A difference between a width of the first gate and a width of the first metal oxide layer is less than 0.5 μm. The source and the drain are electrically connected to the second metal oxide layer.

At least one embodiment of the disclosure provides a manufacturing method of a semiconductor device, which includes the following steps. A first metal oxide layer is formed on a substrate. A second metal oxide layer is formed on the first metal oxide layer. The second metal oxide layer covers a top surface and a sidewall of the first metal oxide layer, and the second metal oxide layer has a stepped structure at the sidewall of the first metal oxide layer. A thickness of the second metal oxide layer is greater than or equal to a thickness of the first metal oxide layer. A first gate dielectric layer is formed on the second metal oxide layer. A first gate is formed on the first gate dielectric layer, and the first gate overlaps with the first metal oxide layer. A difference between a width of the first gate and a width of the first metal oxide layer is less than 0.5 μm. A source region, a drain region, and a channel region located between the source region and the drain region are formed in the second metal oxide layer. A carrier mobility of the first metal oxide layer is greater than a carrier mobility of the channel region of the second metal oxide layer. A source and a drain electrically connected to the second metal oxide layer are formed.

BRIEF DESCRIPTION OF THE DRAWINGS

FIG. 4A to FIG. 4G are schematic cross-sectional views of a manufacturing method of the semiconductor device of FIG. 3A and FIG. 3B.

FIG. 6A to FIG. 6H are schematic cross-sectional views of a manufacturing method of the semiconductor device of FIG. 5A and FIG. 5B.

DETAILED DESCRIPTION OF DISCLOSED EMBODIMENTS

Figure 1A:
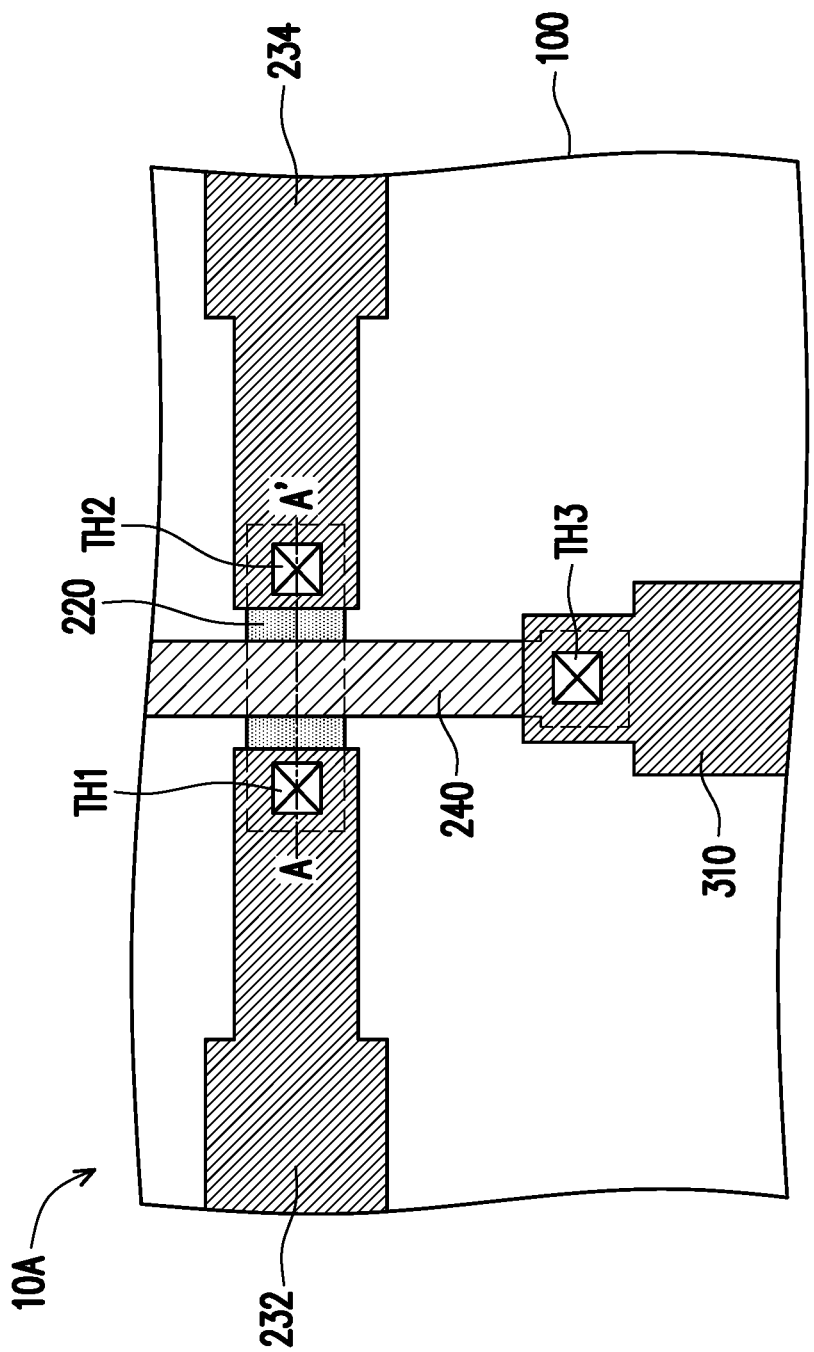
FIG. 1A is a schematic top view of a semiconductor device according to an embodiment of the disclosure.
Figure 1B:
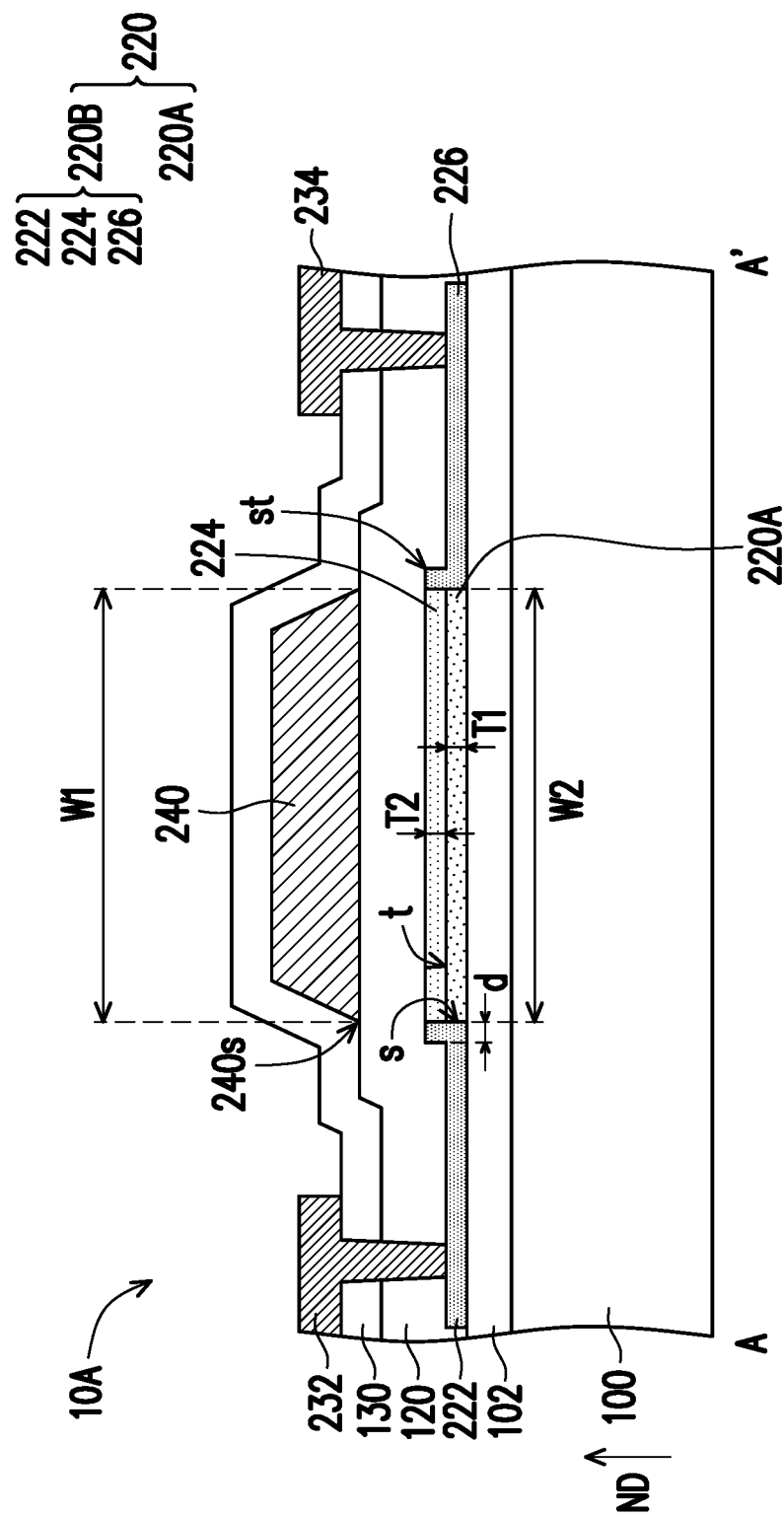
FIG. 1B is a schematic cross-sectional view taken along a line A-A' of FIG. 1A.

FIG. 1A is a schematic top view of a semiconductor device according to an embodiment of the disclosure. FIG. 1B is a schematic cross-sectional view taken along a line A-A' of FIG. 1A.

Please refer to FIG. 1A and FIG. 1B. A semiconductor device 10A includes a substrate 100, a semiconductor structure 220, a first gate dielectric layer 120, a first gate 240, a source 232, and a drain 234. In some embodiments, the semiconductor device 10A further includes a buffer layer 102 and an interlayer dielectric layer 130.

The material of the substrate 100 may be glass, quartz, organic polymer, opaque/reflective material (for example, conductive material, metal, wafer, ceramics, or other suitable materials), or other suitable materials. If the conductive material or the metal is used, an insulating layer (not shown) is covered on the substrate 100 to avoid short circuit.

The buffer layer 102 is formed on a surface of the substrate 100. The material of the buffer layer 102 includes, for example, silicon oxide, silicon nitride, silicon oxynitride, or other insulating materials. In some embodiments, the buffer layer 102 has a single-layer structure or a multi-layer structure.

A semiconductor structure 220 is located on the substrate 100. In this embodiment, the semiconductor structure 220 is formed on the buffer layer 102. The semiconductor structure 220 includes a first metal oxide layer 220A and a second metal oxide layer 220B.

The first metal oxide layer 220A is formed on the buffer layer 102. In some embodiments, the first metal oxide layer 220A includes at least one of indium element, tungsten element, gallium element, zinc element, and tin element. For example, the first metal oxide layer 220A is InWZnO (IWZO) or InGaZnO (IGZO).

The second metal oxide layer 220B covers a top surface t and a sidewall s of the first metal oxide layer 220A. The second metal oxide layer 220B is conformally formed on the first metal oxide layer 220A, and the second metal oxide layer 220B has a stepped structure st at the sidewall s of the first metal oxide layer 220A. In some embodiments, the second metal oxide layer 220B includes at least one of indium element, gallium element, and zinc element. For example, the second metal oxide layer 220B is InGaZnO (IGZO).

In this embodiment, the second metal oxide layer 220B includes a source region 222, a drain region 226, and a channel region 224 located between the source region 222 and the drain region 226. The channel region 224 overlaps with the first metal oxide layer 220A in a normal direction ND of a top surface of the substrate 100, and the channel region 224 covers the top surface t of the first metal oxide layer 220A. The source region 222 and the drain region 226 cover the sidewall s of the first metal oxide layer 220A. In some embodiments, the stepped structure st is located in the source region 222 and/or the drain region 226.

The source region 222 and the drain region 226 are, for example, regions doped with hydrogen. The resistivities of the source region 222 and the drain region 226 are less than the resistivity of the channel region 224. In some embodiments, the oxygen concentrations of the source region 222 and the drain region 226 are less than the oxygen concentration of the channel region 224, and the hydrogen concentrations of the source region 222 and the drain region 226 are greater than the hydrogen concentration of the channel region 224.

The carrier mobility of the first metal oxide layer 220A is greater than the carrier mobility of the channel region 224 of the second metal oxide layer 220B. For example, the carrier mobility of the first metal oxide layer 220A is 25 cm$^2$/Vs to 35 cm$^2$/Vs, and the carrier mobility of the channel region 224 of the second metal oxide layer 220B is 8 cm$^2$/Vs to 10 cm$^2$/Vs. In some embodiments, through adjusting the oxygen concentrations and/or the indium concentrations in the first metal oxide layer 220A and the second metal oxide layer 220B, the carrier mobility of the first metal oxide layer 220A is greater than the carrier mobility of the channel region 224 of the second metal oxide layer 220B. In some embodiments, the oxygen concentrations of the channel region 224, the source region 222, and the drain region 226 of the second metal oxide layer 220B are greater than the oxygen concentration of the first metal oxide layer 220A, and the oxygen vacancy concentration of the channel region 224 of the second metal oxide layer 220B is less than the oxygen vacancy concentration of the first metal oxide layer 220A. In some embodiments, the indium concentrations of the channel region 224, the source region 222, and the drain region 226 of the second metal oxide layer 220B are less than the indium concentration of the first metal oxide layer 220A.

A thickness T2 of the second metal oxide layer 220B is greater than or equal to a thickness T1 of the first metal oxide layer 220A. In some embodiments, the thickness T2 of the second metal oxide layer 220B is 15 nm to 25 nm, and the thickness T1 of the first metal oxide layer 220A is 5 nm to 15 nm.

The first gate dielectric layer 120 is located on the semiconductor structure 220. The first gate dielectric layer 120 includes an inorganic material (for example, silicon oxide, silicon nitride, silicon oxynitride, hafnium oxide, aluminum oxide, other suitable materials, or a stacked layer of at least two of the above materials), an organic material, other suitable materials, or a combination of the above.

The first gate 240 is located on the first gate dielectric layer 120 and overlaps with the first metal oxide layer 220A and the channel region 224 of the second metal oxide layer 220B in the normal direction ND of the top surface of the substrate 100. The material of the first gate 240 is, for example, chromium, gold, silver, copper, tin, lead, hafnium, tungsten, molybdenum, neodymium, titanium, tantalum, aluminum, zinc, other metals, an alloy of the above, a metal oxide of the above, a metal nitride of the above, a combination of the above, or other conductive materials. In this embodiment, the first gate 240 is a stacked layer of titanium, aluminum, and titanium. When the first gate 240 contains aluminum element, the first gate 240 may serve as a hydrogen barrier, thereby reducing the probability of hydrogen atoms diffusing into the channel region 224.

The difference between a width W1 of the first gate 240 and a width W2 of the first metal oxide layer 220A is less than 0.5 μm. In a preferred embodiment, an edge 240s of the first gate 240 and the sidewall s of the first metal oxide layer 220A overlap in the normal direction ND of the top surface of the substrate 100. Based on the above, the probability of the first metal oxide layer 220A being damaged by an etching solution or ultraviolet light during a subsequent process can be reduced.

A horizontal distance d between the edge 240s of the first gate 240 and a riser of the stepped structure st of the second metal oxide layer 220B is less than 0.5 μm, and the stepped structure st of the semiconductor structure 220 is substantially adjacent to the edge of the first gate 240. When the semiconductor device 10A is operated, a strong electric field is likely to appear at the edge 240s of the first gate 240. By disposing the stepped structure st with thickness variation of the semiconductor structure 220 at a position adjacent to the edge 240s of the first gate 240, the hot carrier effect caused by the electric field of the first gate 240 can be reduced, thereby improving the reliability of the semiconductor device 10A.

The interlayer dielectric layer 130 is located on the first gate dielectric layer 120 and the first gate 240. Two contact holes penetrate the interlayer dielectric layer 130 and the first gate dielectric layer 120, and extend to the source region 222 and the drain region 226 of the second metal oxide layer 220B.

The interlayer dielectric layer 130 includes an inorganic material (for example, silicon oxide, silicon nitride, silicon oxynitride, hafnium oxide, aluminum oxide, other suitable materials, or a stacked layer of at least two of the above materials), an organic material, other suitable materials, or a combination of the above. In some embodiments, the interlayer dielectric layer 130 includes hydrogen element. In some embodiments, during the process of manufacturing the semiconductor device 10A, the hydrogen element in the interlayer dielectric layer 130 is diffused into the source region 222 and the drain region 226 of the second metal oxide layer 220B through a heat treatment process, but the disclosure is not limited thereto. In other embodiments, the hydrogen element is diffused into the source region 222 and the drain region 226 through a hydrogen plasma process or other doping processes.

The source 232 and the drain 234 are located on the interlayer dielectric layer 130 and are filled in a first contact hole TH1 and a second contact hole TH2 penetrating the interlayer dielectric layer 130 and the first gate dielectric layer 120 to be respectively electrically connected to the source region 222 and the drain region 226 of the second metal oxide layer 220B.

A signal line 310 is located on the interlayer dielectric layer 130 and is filled in a third contact hole TH3 penetrating the interlayer dielectric layer 130 to be electrically connected to the first gate 240.

In some embodiments, the materials of the signal line 310, the source 232, and the drain 234 are, for example, chromium, gold, silver, copper, tin, lead, hafnium, tungsten, molybdenum, neodymium, titanium, tantalum, aluminum, zinc, other metals, an alloy of the above, a metal oxide of the above, a metal nitride of the above, a combination of the above, or other conductive materials. In this embodiment, the signal line 310, the source 232, and the drain 234 are stacked layers of titanium, aluminum, and titanium.

In this embodiment, the semiconductor device 10A is a top-gate thin film transistor, which has the advantage of fast response and is suitable for use as a switching element.

FIG. 2A to FIG. 2G are schematic cross-sectional views of a manufacturing method of the semiconductor device 10A of FIG. 1A and FIG. 1B.

Figure 2A:
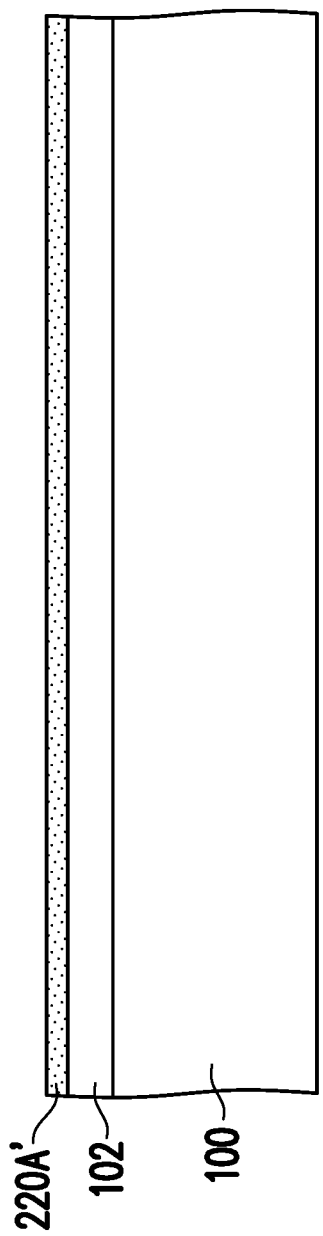
FIG. 2A to FIG. 2G are schematic cross-sectional views of a manufacturing method of the semiconductor device of FIG. 1A and FIG. 1B.
Figure 2B:
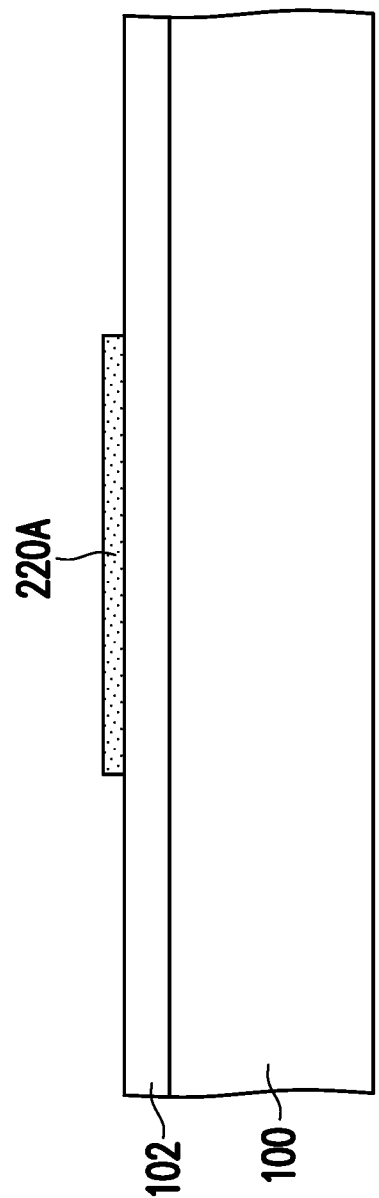

Please refer to FIG. 2A and FIG. 2B. The first metal oxide layer 220A is formed on the substrate 100. First, a blanketed first metal oxide material layer 220A' is formed on the substrate 100 and the buffer layer 102. Then, a patterned photoresist (not shown) is formed on the first metal oxide material layer 220A' by using a lithography process. Next, a wet or dry etching process is performed on the first metal oxide material layer 220A' by using the patterned photoresist as a mask, so as to form the first metal oxide layer 220A. Finally, the patterned photoresist is removed.

Figure 2C:
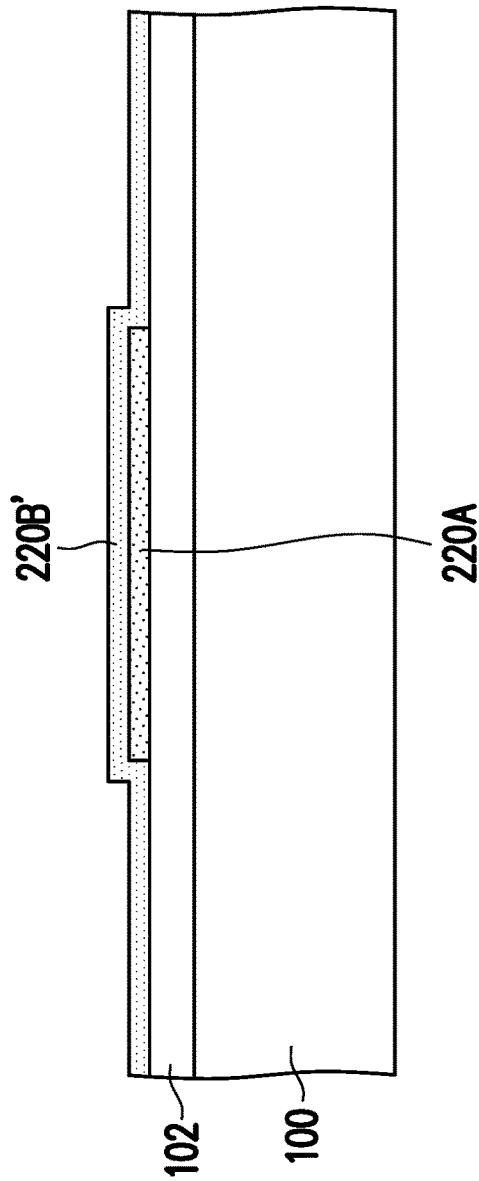
Figure 2D:
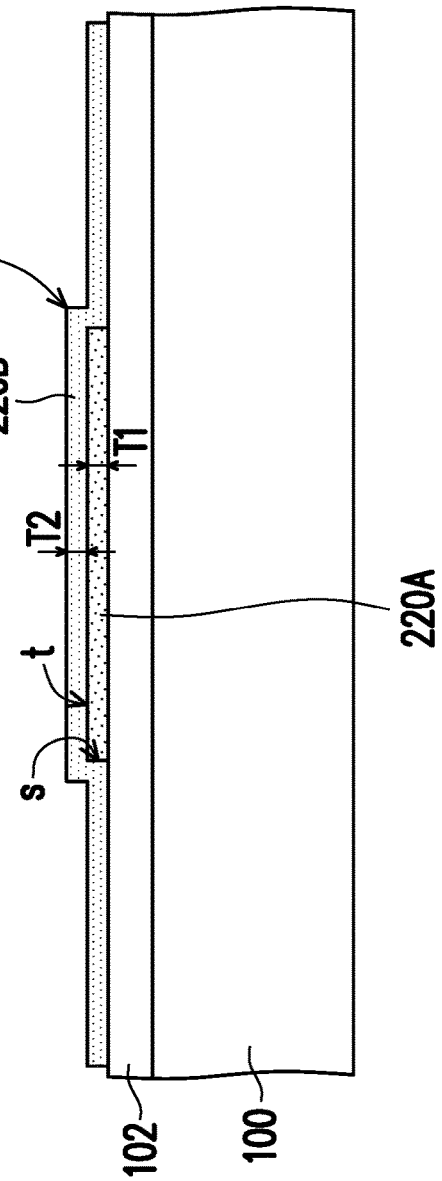

Please refer to FIG. 2C and FIG. 2D. The second metal oxide layer 220B is formed on the first metal oxide layer 220A. First, a blanketed second metal oxide material layer 220B' is formed on the substrate 100, the buffer layer 102, and the first metal oxide layer 220A. Then, a patterned photoresist (not shown) is formed on the second metal oxide material layer 220B' by using a lithography process. Next, a wet or dry etching process is performed on the second metal oxide material layer 220B' by using the patterned photoresist as a mask, so as to form the second metal oxide layer 220B. Finally, the patterned photoresist is removed.

The second metal oxide layer 220B covers the top surface t and the sidewall s of the first metal oxide layer 220A, and the second metal oxide layer 220B has the stepped structure st at the sidewall s of the first metal oxide layer 220A.

Figure 2E:
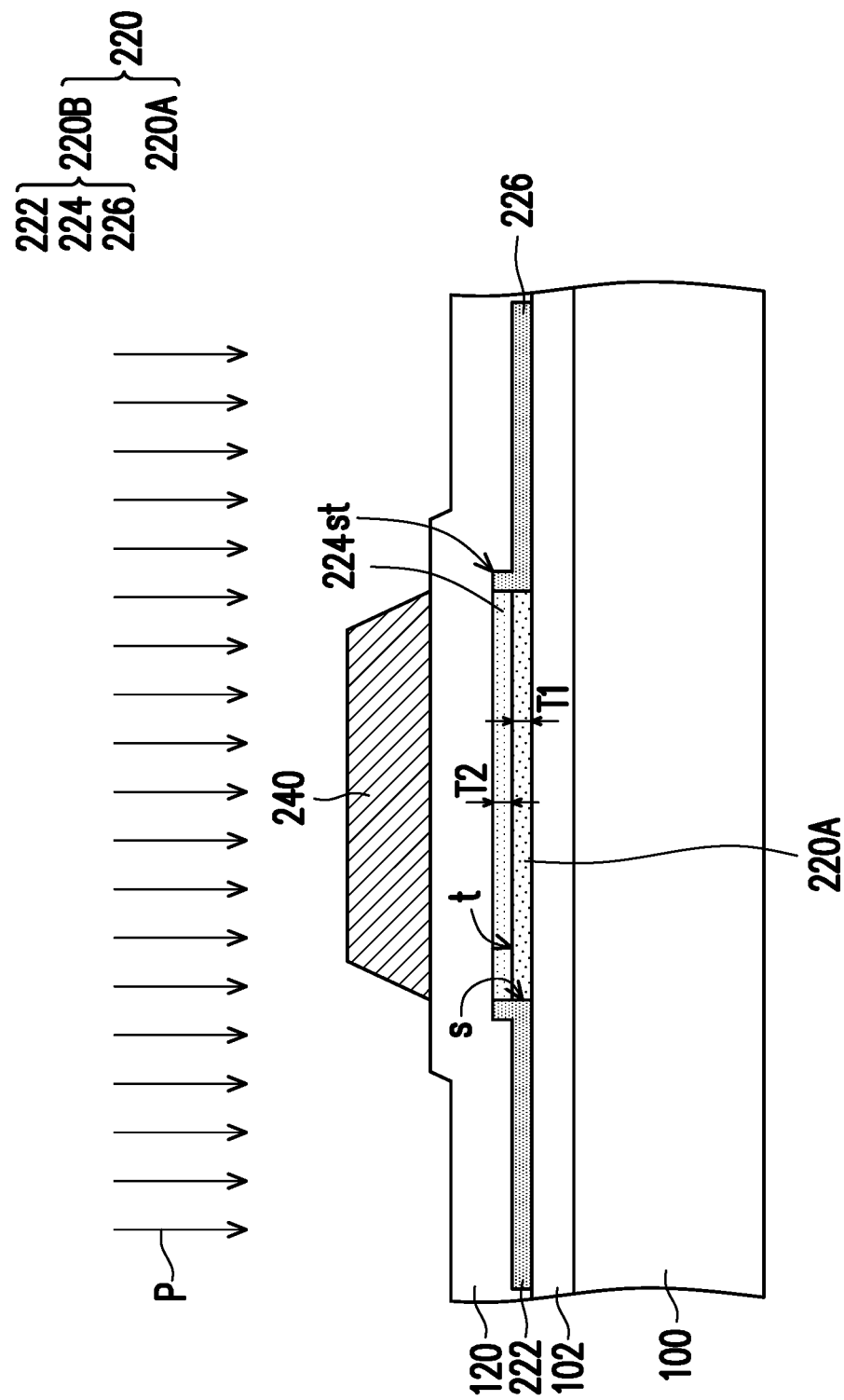

Please refer to FIG. 2E. The first gate dielectric layer 120 is formed on the second metal oxide layer 220B. The first gate 240 is formed on the first gate dielectric layer 120. The first gate 240 overlaps with the first metal oxide layer 220A.

Using the first gate 240 as a mask, a doping process P is performed on the second metal oxide layer 220B to form the source region 222, the drain region 226, and the channel region 224 in the second metal oxide layer 220B. In some embodiments, the doping process P is, for example, a hydrogen plasma process.

Figure 2F:
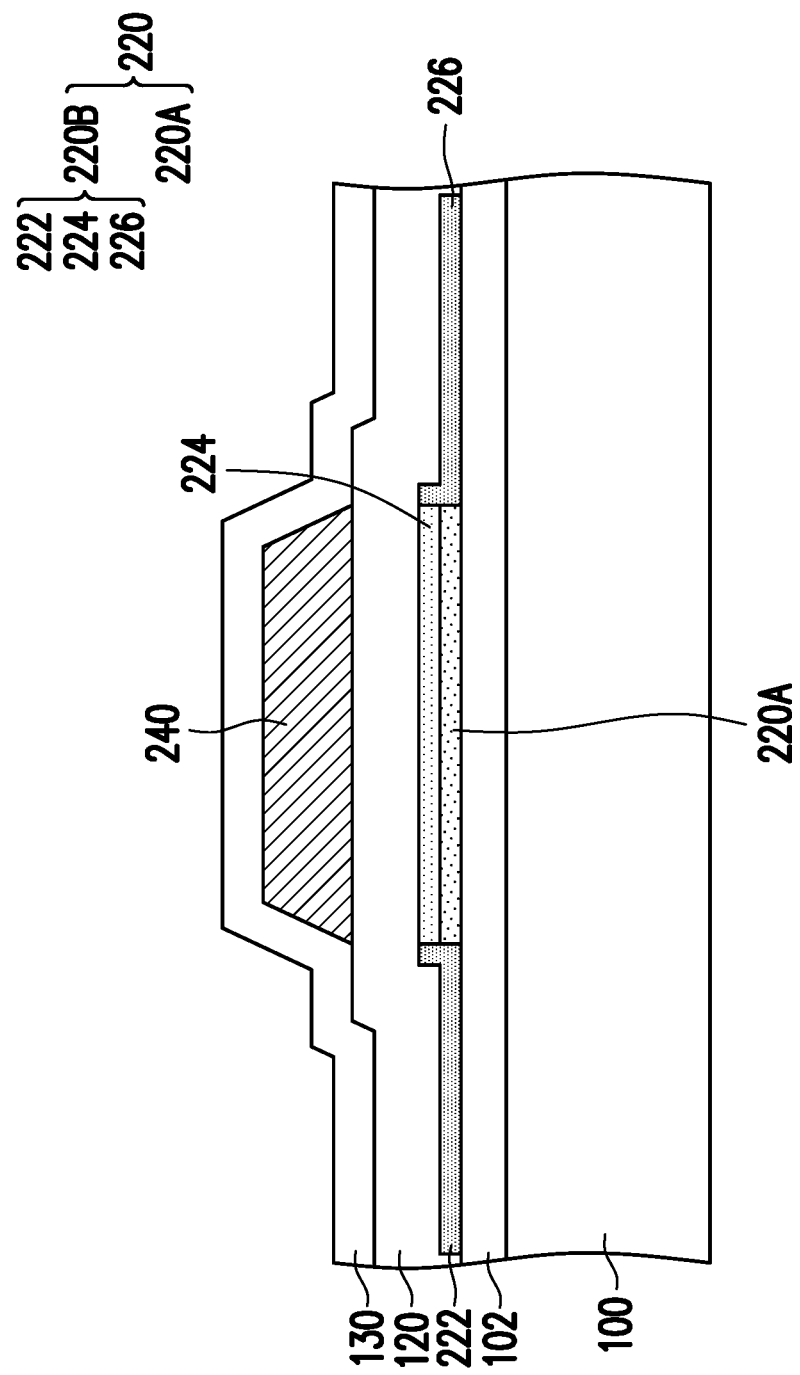

Please refer to FIG. 2F. The interlayer dielectric layer 130 is formed on the first gate 240 and the first gate dielectric layer 120. The interlayer dielectric layer 130 covers the first gate 240.

Figure 2G:
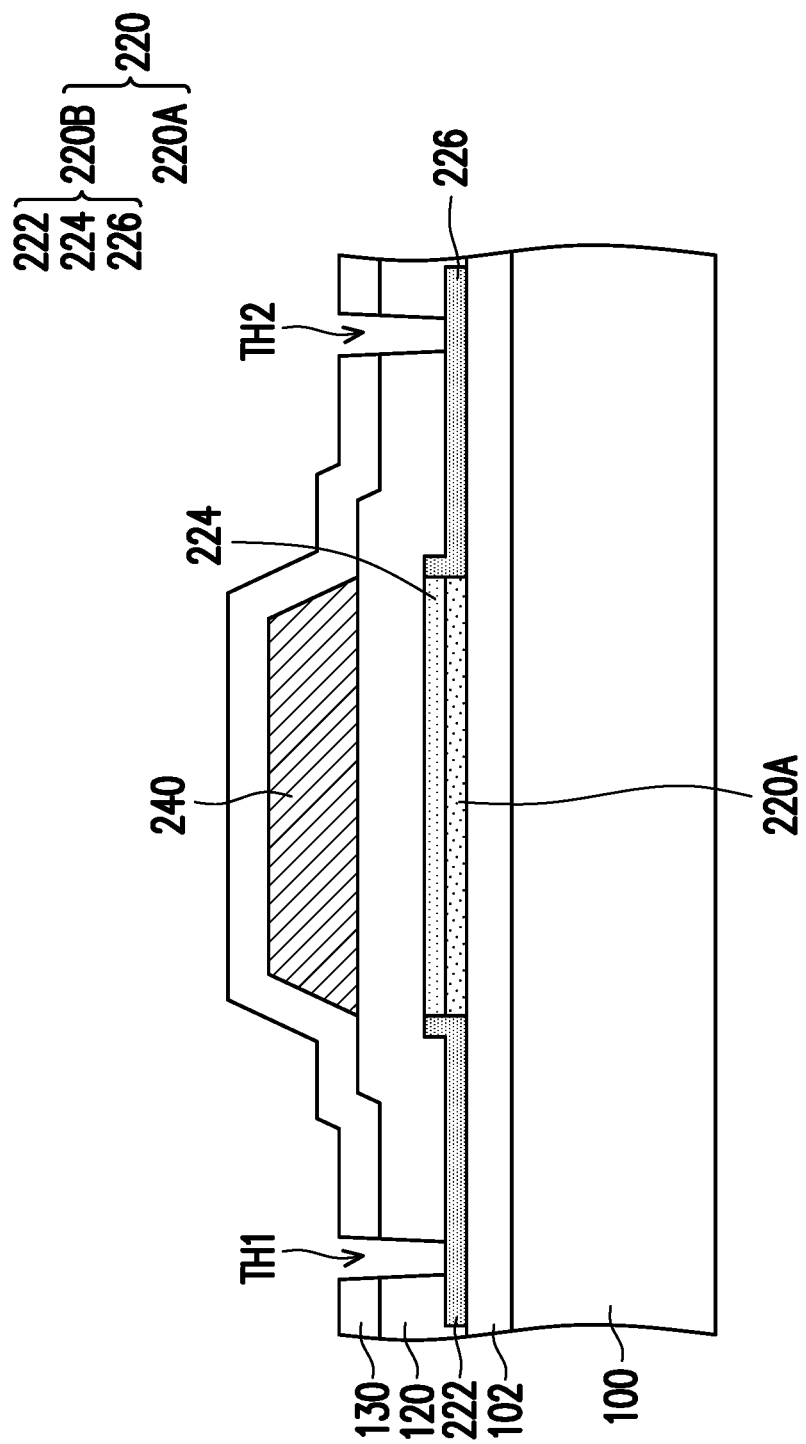

Please refer to FIG. 2G. The first contact hole TH1 and the second contact hole TH2 penetrating the interlayer dielectric layer 130 and the first gate dielectric layer 120 are formed. In some embodiments, a third contact hole (not shown in FIG. 2G) penetrating the interlayer dielectric layer 130 is also simultaneously formed.

Finally, please return to FIG. 1A and FIG. 1B. The source 232, the drain 234, and the signal line 310 are formed. The source 232, the drain 234, and the signal line 310 belong to the same patterned conductive layer. The source 232 and the drain 234 are respectively filled in the first contact hole TH1 and the second contact hole TH2 to be electrically connected to the source region 222 and the drain region 226 of the second metal oxide layer 220B. The signal line 310 is filled in the third contact hole TH3 to be electrically connected to the first gate 240.

Based on the above, the semiconductor structure 220 of the semiconductor device 10A includes the first metal oxide layer 220A and the second metal oxide layer 220B, and the carrier mobility of the first metal oxide layer 220A is greater than the carrier mobility of the channel region 224 of the second metal oxide layer 220B, thereby increasing the drain current of the semiconductor device 10A. In addition, since the difference between the width W1 of the first gate 240 and the width W2 of the first metal oxide layer 220A is less than 0.5 μm, the hot carrier effect caused by the electric field of the first gate 240 can be reduced, thereby improving the reliability of the semiconductor device 10A.

Figure 3A:
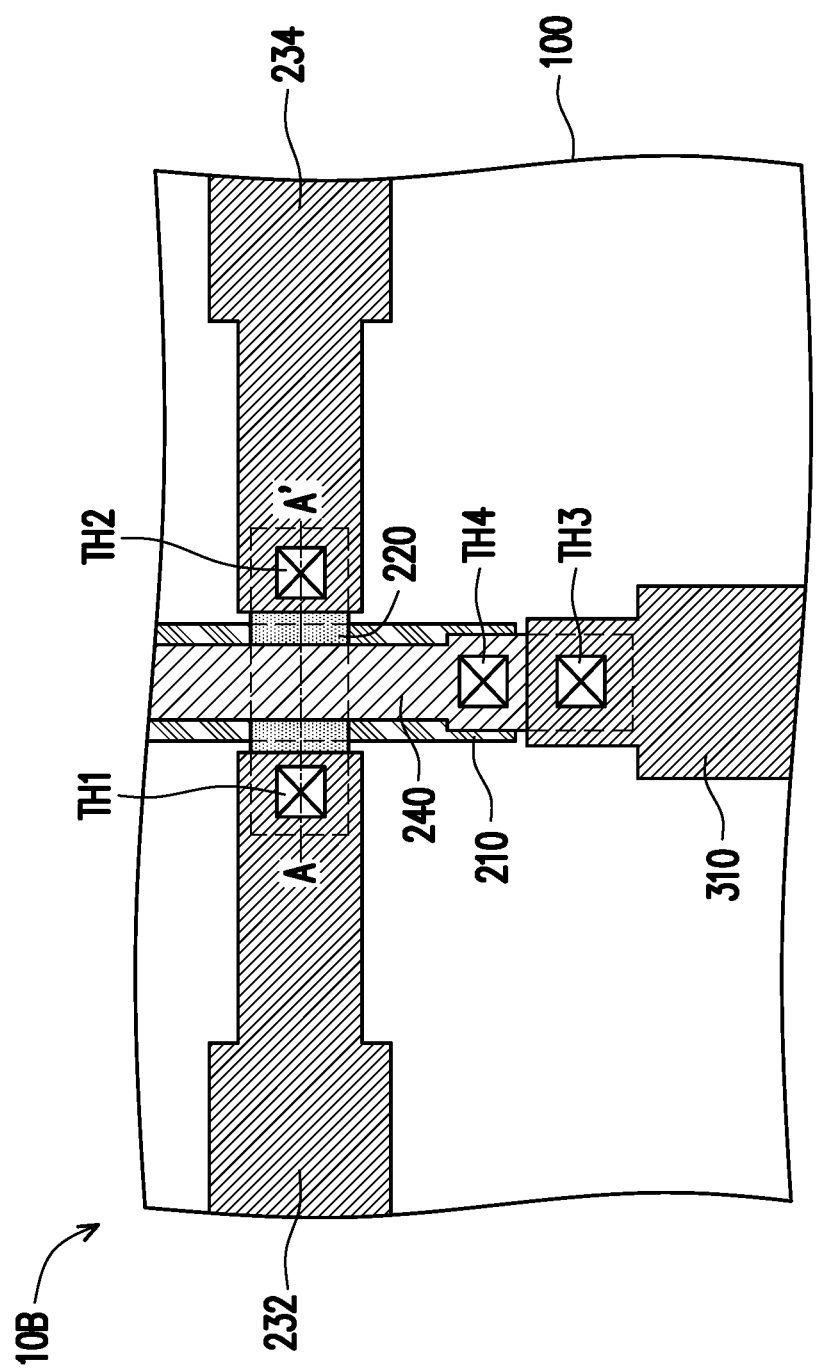
FIG. 3A is a schematic top view of a semiconductor device according to an embodiment of the disclosure.
Figure 3B:
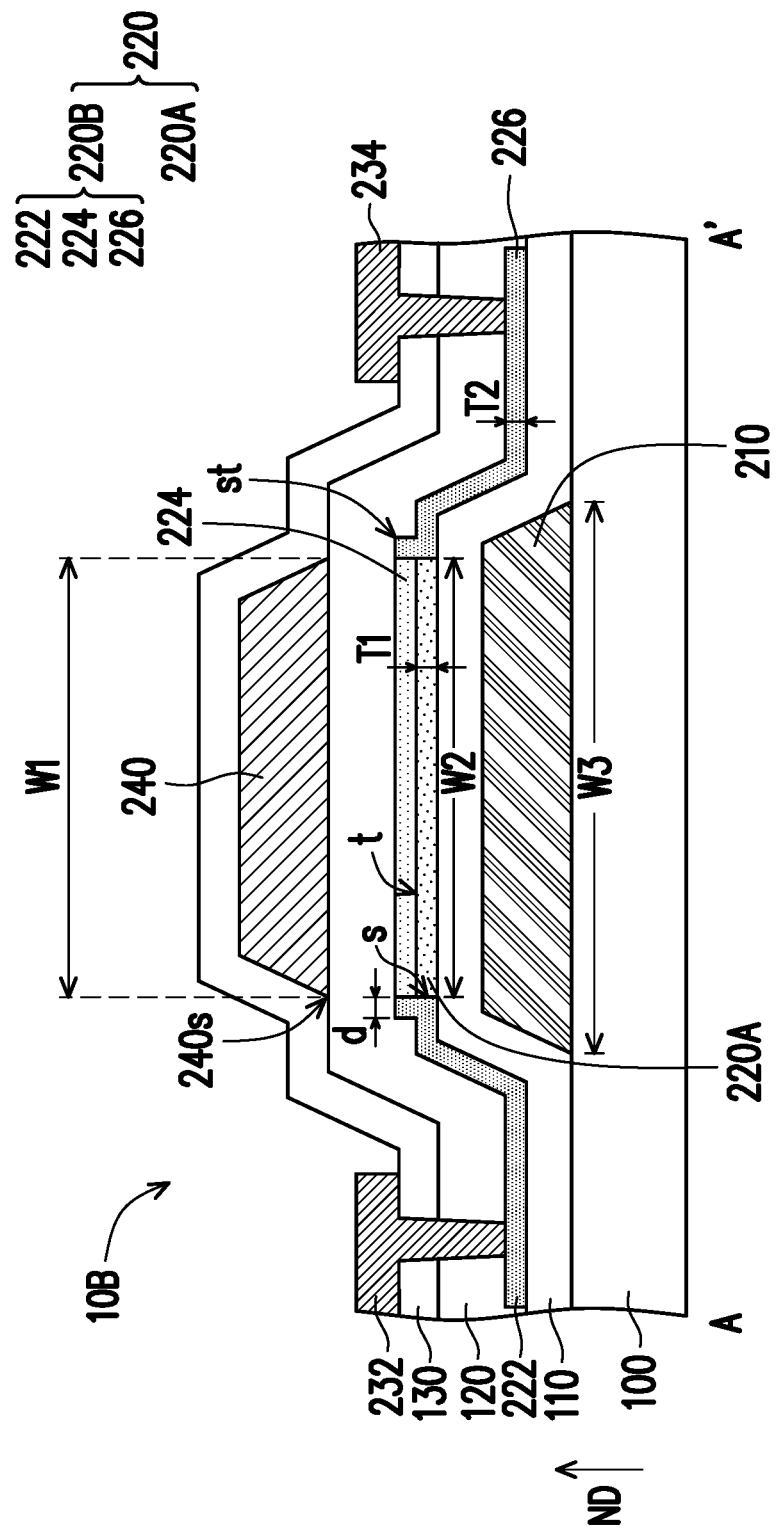
FIG. 3B is a schematic cross-sectional view taken along a line A-A' of FIG. 3A.

FIG. 3A is a schematic top view of a semiconductor device according to an embodiment of the disclosure. FIG. 3B is a schematic cross-sectional view taken along a line A-A' of FIG. 3A. It must be noted here that the embodiment of FIG. 3A and FIG. 3B continue to use the reference numerals and some content of the embodiment of FIG. 1A and FIG. 1B, wherein the same or similar reference numerals are adopted to denote the same or similar elements, and the description of the same technical content is omitted. For the description of the omitted part, reference may be made to the above embodiments, which will not be repeated here.

The main difference between a semiconductor device 10B of FIG. 3A and FIG. 3B and the semiconductor device 10A of FIG. 1A is that the semiconductor device 10B further includes a second gate dielectric layer 110 and a second gate 210.

The second gate 210 is located above the substrate 100. In some embodiments, a buffer layer (not shown in FIG. 3A) is further sandwiched between the second gate 210 and the substrate 100. The material of the second gate 210 is, for example, chromium, gold, silver, copper, tin, lead, hafnium, tungsten, molybdenum, neodymium, titanium, tantalum, aluminum, zinc, other metals, an alloy of the above, a metal oxide of the above, a metal nitride of the above, a combination of the above, or other conductive materials.

The second gate dielectric layer 110 is located on the second gate 210. The second gate dielectric layer 110 is located between the semiconductor structure 220 and the substrate 100. The second gate 210 is located between the second gate dielectric layer 110 and the substrate 100. The second gate 210 overlaps with the semiconductor structure 220, and a width W3 of the second gate 210 is greater than the width W2 of the first metal oxide layer 210. In some embodiments, the first gate 240 is filled in a fourth contact hole TH4 penetrating the first gate dielectric layer 120 and the second gate dielectric layer 110, and is electrically connected to the second gate 210.

In this embodiment, the semiconductor structure 220 is formed on the second gate dielectric layer 110. The semiconductor structure 220 includes the first metal oxide layer 220A and the second metal oxide layer 220B.

The carrier mobility of the first metal oxide layer 220A is greater than the carrier mobility of the channel region 224 of the second metal oxide layer 220B. For example, the carrier mobility of the first metal oxide layer 220A is 65 $cm^2$/Vs to 75 $cm^2$/Vs, and the carrier mobility of the channel region 224 of the second metal oxide layer 220B is 16 $cm^2$/Vs to 23 $cm^2$/Vs. In some embodiments, through adjusting the oxygen concentrations and/or the indium concentrations in the first metal oxide layer 220A and the second metal oxide layer 220B, the carrier mobility of the first metal oxide layer 220A is greater than the carrier mobility of the channel region 224 of the second metal oxide layer 220B. In some embodiments, the oxygen concentrations of the channel region 224, the source region 222, and the drain region 226 of the second metal oxide layer 220B is greater than the oxygen concentration of the first metal oxide layer 220A, and the oxygen vacancy concentration of the channel region 224 of the second metal oxide layer 220B is less than the oxygen vacancy concentration of the first metal oxide layer 220A. In some embodiments, the indium concentrations of the channel region 224, the source region 222, and the drain region 226 of the second metal oxide layer 220B are lower than the indium concentration of the first metal oxide layer 220A.

The thickness T2 of the second metal oxide layer 220B is greater than or equal to the thickness T1 of the first metal oxide layer 220A. In some embodiments, the thickness T2 of the second metal oxide layer 220B is 15 nm to 25 nm, and the thickness T1 of the first metal oxide layer 220A is 5 nm to 15 nm.

The first gate 240 is located on the first gate dielectric layer 120 and overlaps with the first metal oxide layer 220A, the channel region 224 of the second metal oxide layer 220B, and the second gate 210 in the normal direction ND of the top surface of the substrate 100. The semiconductor structure 220 is located between the first gate 240 and the second gate 210.

The difference between the width W1 of the first gate 240 and the width W2 of the first metal oxide layer 220A is less than 0.5 μm. In a preferred embodiment, the edge 240s of the first gate 240 and the sidewall s of the first metal oxide layer 220A overlap in the normal direction ND of the top surface of the substrate 100. Based on the above, the probability of the first metal oxide layer 220A being damaged by an etching solution or ultraviolet light during a subsequent process can be reduced.

The horizontal distance d between the edge 240s of the first gate 240 and the riser of the stepped structure st of the second metal oxide layer 220B is less than 0.5 μm, and the stepped structure st of the semiconductor structure 220 is substantially adjacent to the edge 240s of the first gate 240. When the semiconductor device 10B is operated, a strong electric field is likely to appear at the edge 240s of the first gate 240. By disposing the stepped structure st with thickness variation of the semiconductor structure 220 at a position adjacent to the edge of the first gate 240, the hot carrier effect caused by the electric field of the first gate 240 can be reduced, thereby improving the reliability of the semiconductor device 10B.

In this embodiment, the semiconductor device 10B includes a dual-gate thin film transistor, which has the advantage of large drain current and is suitable for use as a driving element.

FIG. 4A to FIG. 4G are schematic cross-sectional views of a manufacturing method of the semiconductor device 10B of FIG. 3A and FIG. 3B.

Please refer to FIG. 4A. The second gate 210 is formed on the substrate 100. The second gate dielectric layer 110 is formed on the second gate 210. The blanketed first metal oxide material layer 220A' is formed on the substrate 100 and the second gate dielectric layer 110.

Please refer to FIG. 4B. The first metal oxide material layer 220A' is patterned to form the first metal oxide layer 220A on the second gate dielectric layer 110.

Please refer to FIG. 4C to FIG. 4D. The second metal oxide layer 220B is formed on the first metal oxide layer 220A. First, the blanketed second metal oxide material layer 220B' is formed on the substrate 100, the second gate dielectric layer 110, and the first metal oxide layer 220A. Then, the second metal oxide material layer 220B' is patterned to form the second metal oxide layer 220B.

Figure 4E:
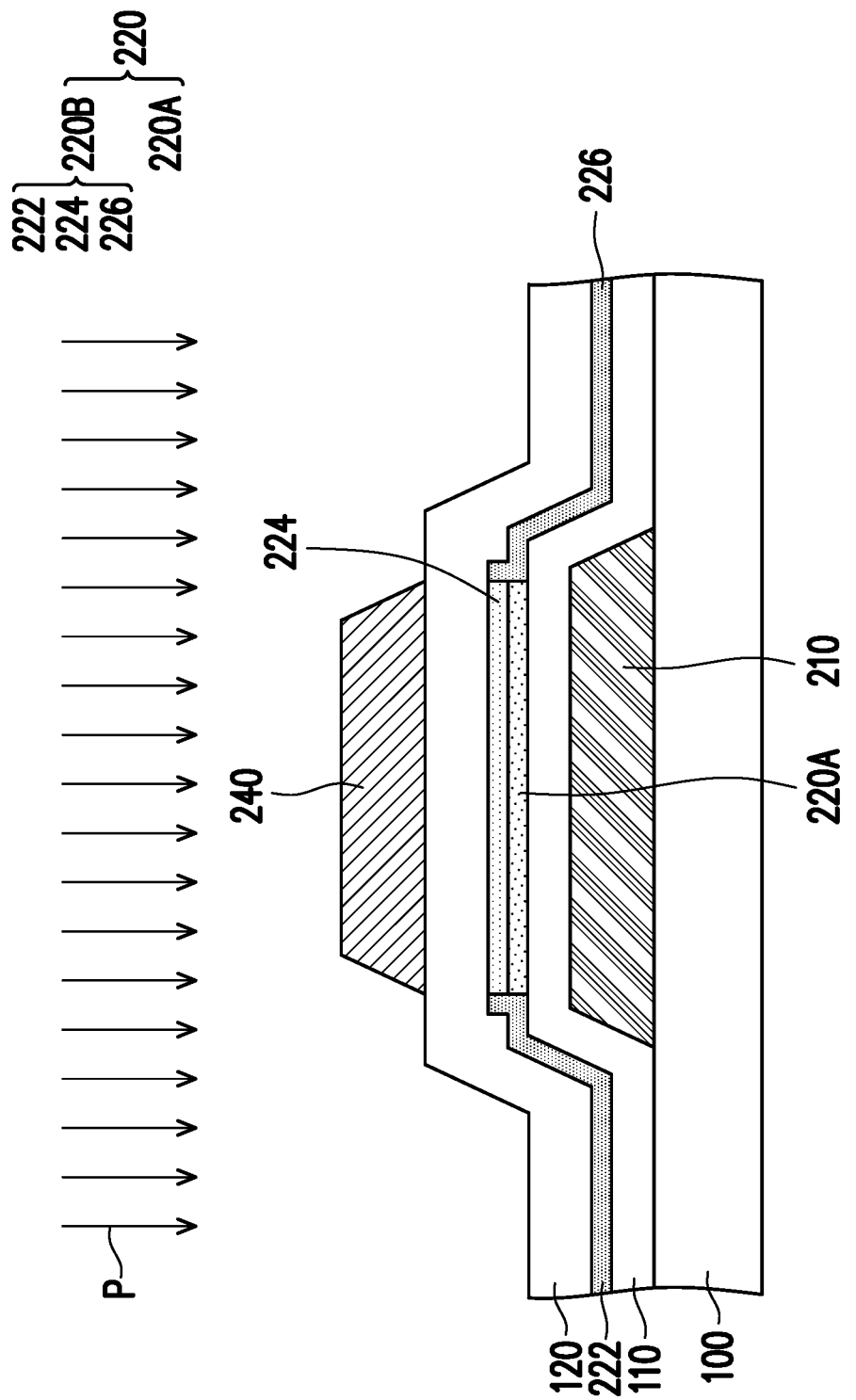

Please refer to FIG. 4E. The first gate dielectric layer 120 is formed on the second metal oxide layer 220B. The first gate 240 is formed on the first gate dielectric layer 120. The first gate 240 overlaps with the first metal oxide layer 220A. In some embodiments, before forming the first gate 240, a fourth contact hole (not shown in FIG. 4E) penetrating the first gate dielectric layer 120 and the second gate dielectric layer 110 is formed. The first gate 240 is electrically connected to the second gate 210 through the fourth contact hole.

Using the first gate 240 as a mask, the doping process P is performed on the second metal oxide layer 220B to form the source region 222, the drain region 226, and the channel region 224 in the second metal oxide layer 220B. In some embodiments, the doping process P is, for example, a hydrogen plasma process.

Figure 4F:
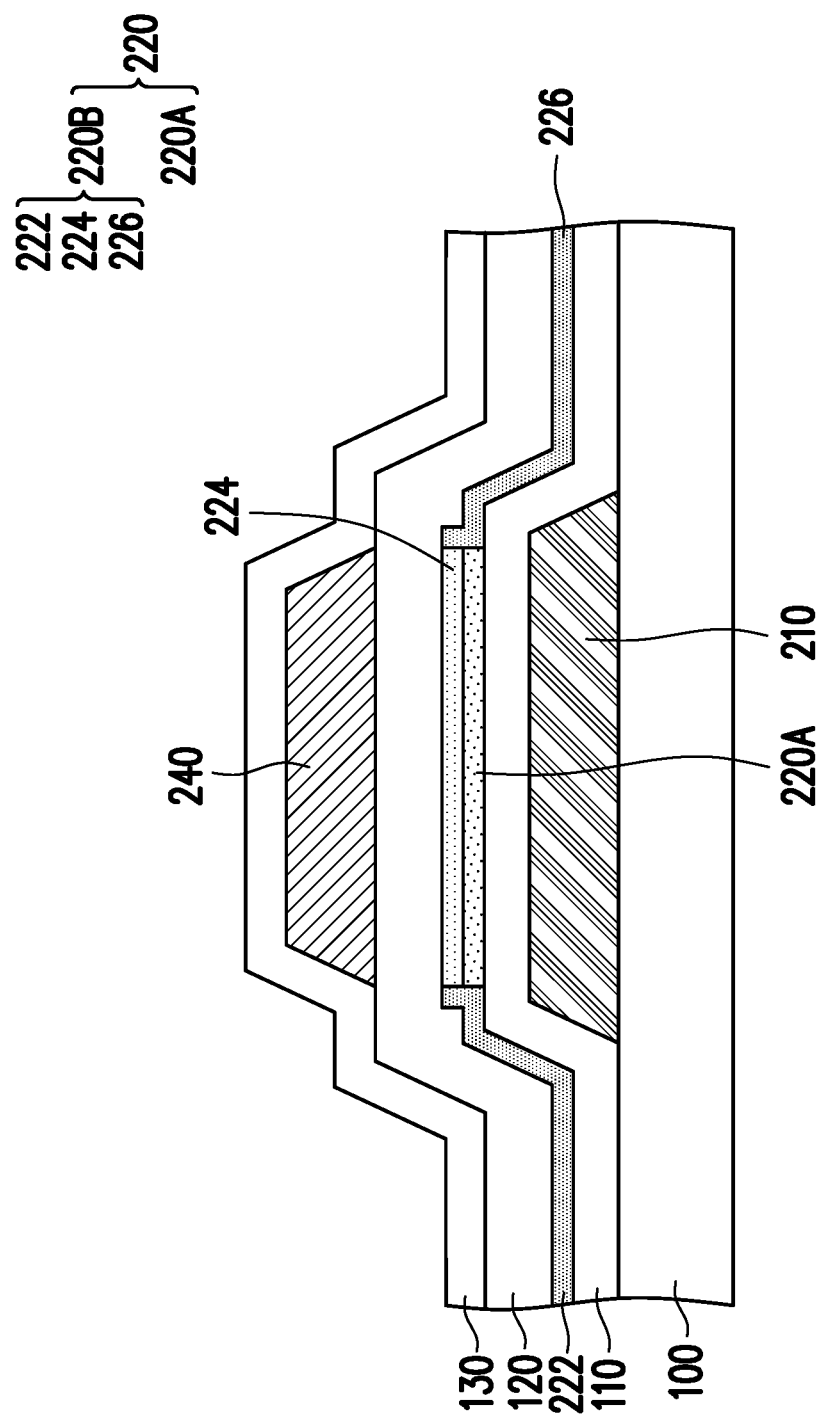

Please refer to FIG. 4F. The interlayer dielectric layer 130 is formed on the first gate 240 and the first gate dielectric layer 120. The interlayer dielectric layer 130 covers the first gate 240.

Figure 4G:
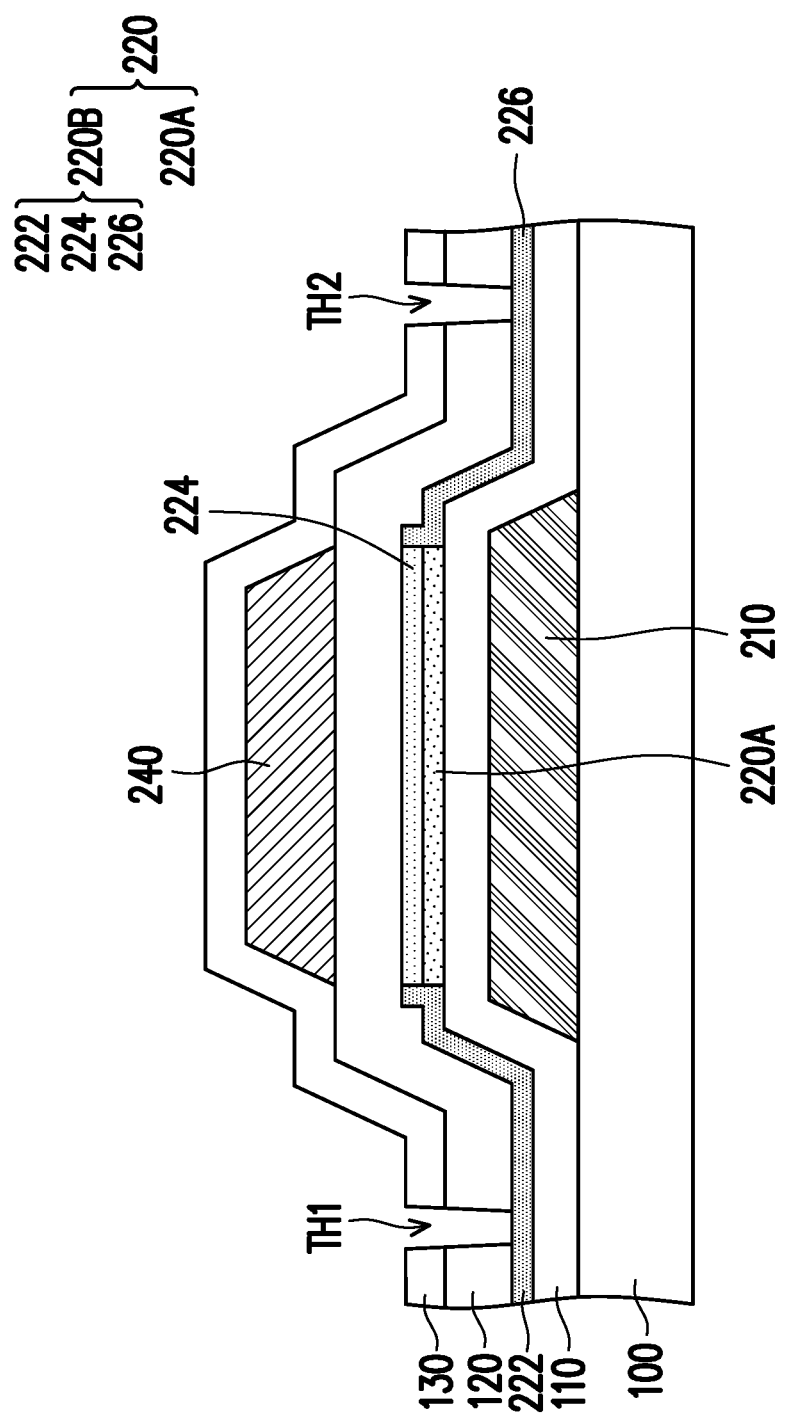

Please refer to FIG. 4G. The first contact hole TH1 and the second contact hole TH2 penetrating the interlayer dielectric layer 130 and the first gate dielectric layer 120 are formed. In some embodiments, the third contact hole (not shown in FIG. 4G) penetrating the interlayer dielectric layer 130 is also simultaneously formed.

Finally, please return to FIG. 3A and FIG. 3B. The source 232, the drain 234, and the signal line 310 are formed. The source 232, the drain 234, and the signal line 310 belong to the same patterned conductive layer. The source 232 and the drain 234 are respectively filled in the first contact hole TH1 and the second contact hole TH2 to be electrically connected to the source region 222 and the drain region 226 of the second metal oxide layer 220B. The signal line 310 is filled in the third contact hole TH3 to be electrically connected to the first gate 240.

Based on the above, the semiconductor structure 220 of the semiconductor device 10B includes the first metal oxide layer 220A and the second metal oxide layer 220B, and the carrier mobility of the first metal oxide layer 220A is greater than the carrier mobility of the channel region 224 of the second metal oxide layer 220B, thereby increasing the drain current of the semiconductor device 10B. In addition, since the difference between the width W1 of the first gate 240 and the width W2 of the first metal oxide layer 220A is less than 0.5 µm, the hot carrier effect caused by the electric field of the first gate 240 can be reduced, thereby improving the reliability of the semiconductor device 10B.

Figure 5A:
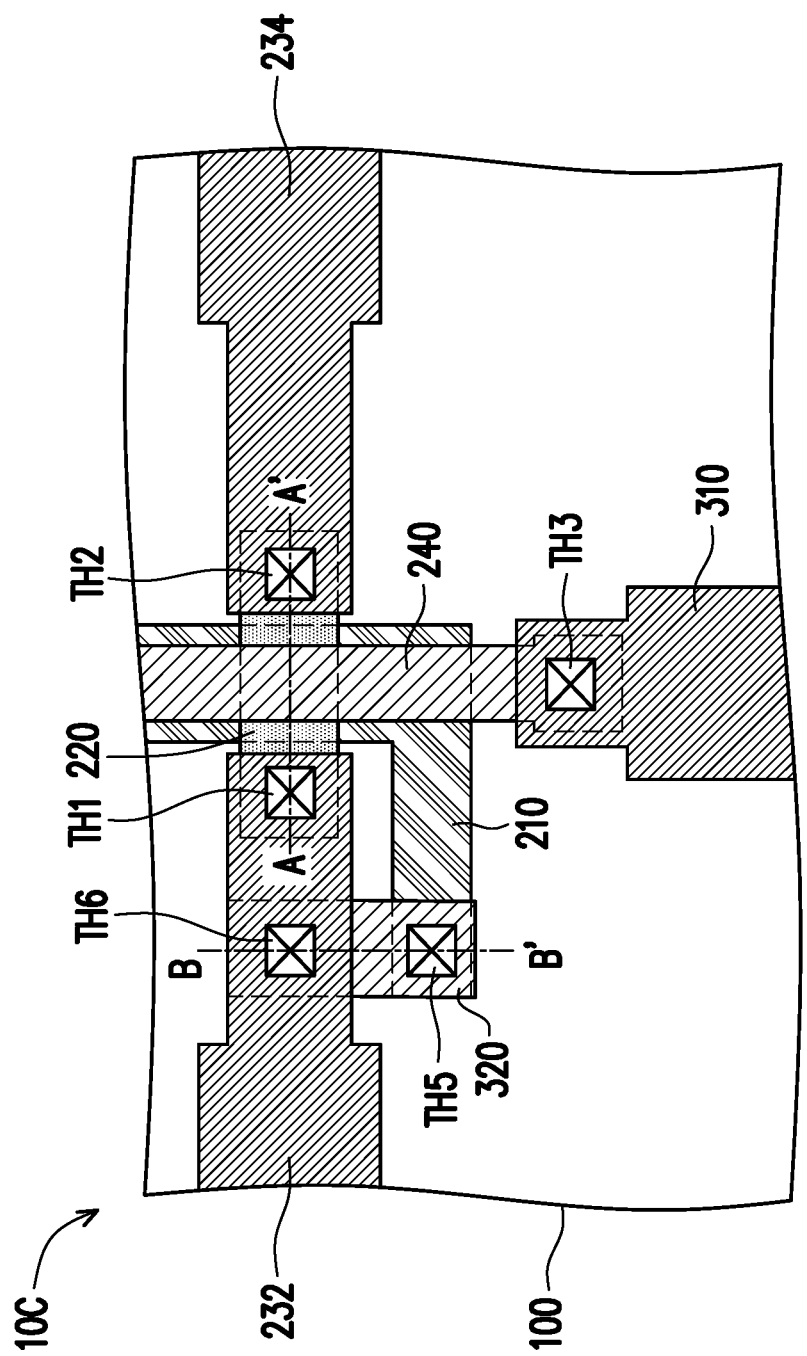
FIG. 5A is a schematic top view of a semiconductor device according to an embodiment of the disclosure.
Figure 5B:
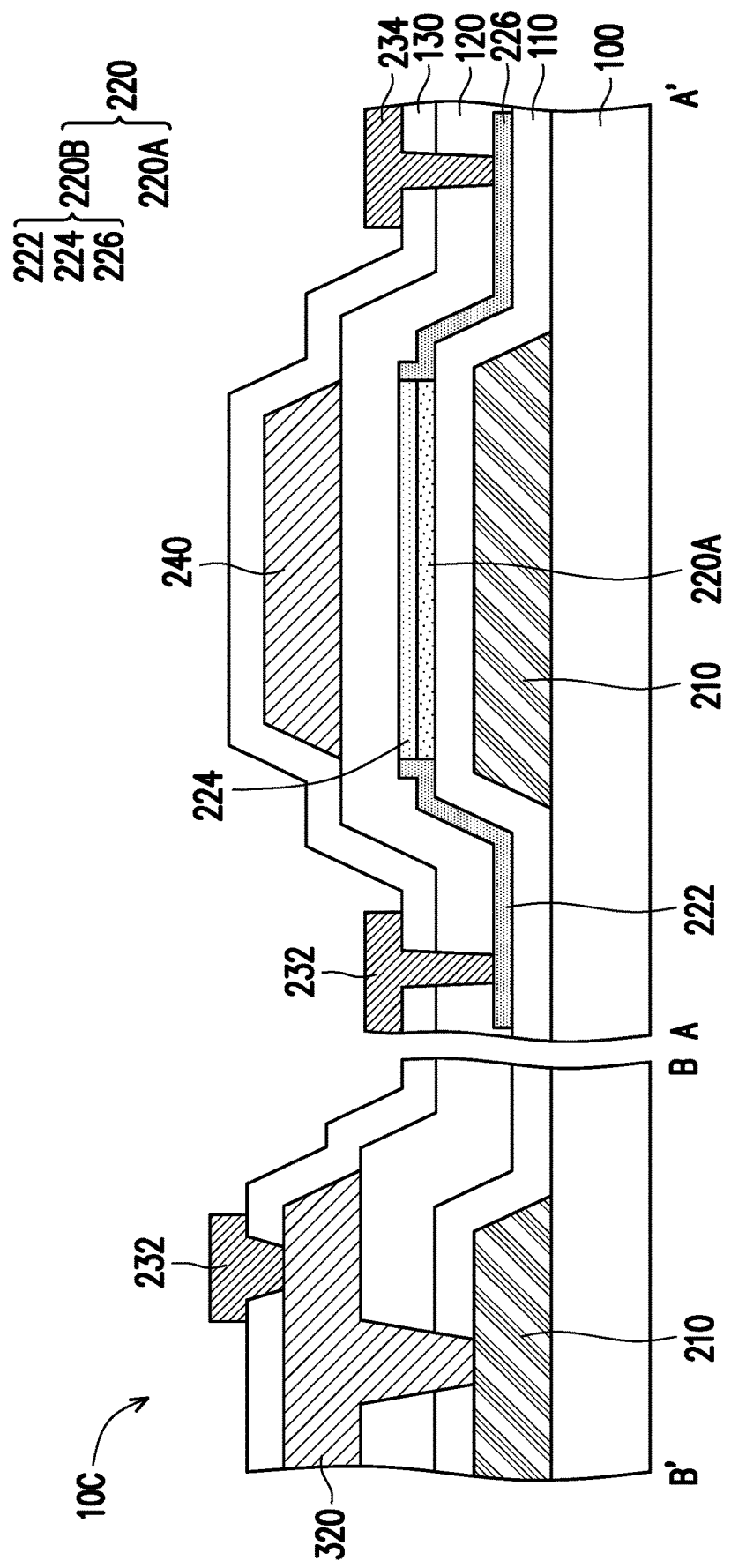
FIG. 5B is a schematic cross-sectional view taken along a line A-A' and a line B-B' of FIG. 5A.

FIG. 5A is a schematic top view of a semiconductor device according to an embodiment of the disclosure. FIG. 5B is a schematic cross-sectional view taken along a line A-A' and a line B-B' of FIG. 5A. It must be noted here that the embodiment of FIG. 5A and FIG. 5B continue to use the reference numerals and some content of the embodiment of FIG. 3A and FIG. 3B, wherein the same or similar reference numerals are adopted to denote the same or similar elements, and the description of the same technical content is omitted. For the description of the omitted part, reference may be made to the above embodiments, which will not be repeated here.

The main difference between a semiconductor device 10C of FIG. 5A and FIG. 5B and the semiconductor device 10B of FIG. 3A is that the source 232 of the semiconductor device 10C is electrically connected to the second gate 210.

Please refer to FIG. 5A and FIG. 5B. The semiconductor device 10C further includes a transfer electrode 320. The transfer electrode 320 is filled in a fifth contact hole TH5 penetrating the second gate dielectric layer 110 and the first gate dielectric layer 120 to be electrically connected to the second gate 210, and the source 232 is filled in a sixth contact hole TH6 penetrating the interlayer dielectric layer 130 to be electrically connected to the transfer electrode 320. In this embodiment, the first gate 240 and the second gate 210 are not directly connected.

In this embodiment, the source 232 of the semiconductor device 10C is electrically connected to the second gate 210, so that the semiconductor device 10C has the advantage of small parasitic capacitance and is suitable for use as a driving element.

In some embodiments, the carrier mobility of the first metal oxide layer 220A is 30 cm²/Vs to 40 cm²/Vs, and the carrier mobility of the channel region 224 of the second metal oxide layer 220B is 3 cm²/Vs to 6 cm²/Vs.

FIG. 6A to FIG. 6H are schematic cross-sectional views of a manufacturing method of the semiconductor device of FIG. 5A and FIG. 5B.

Figure 6A:
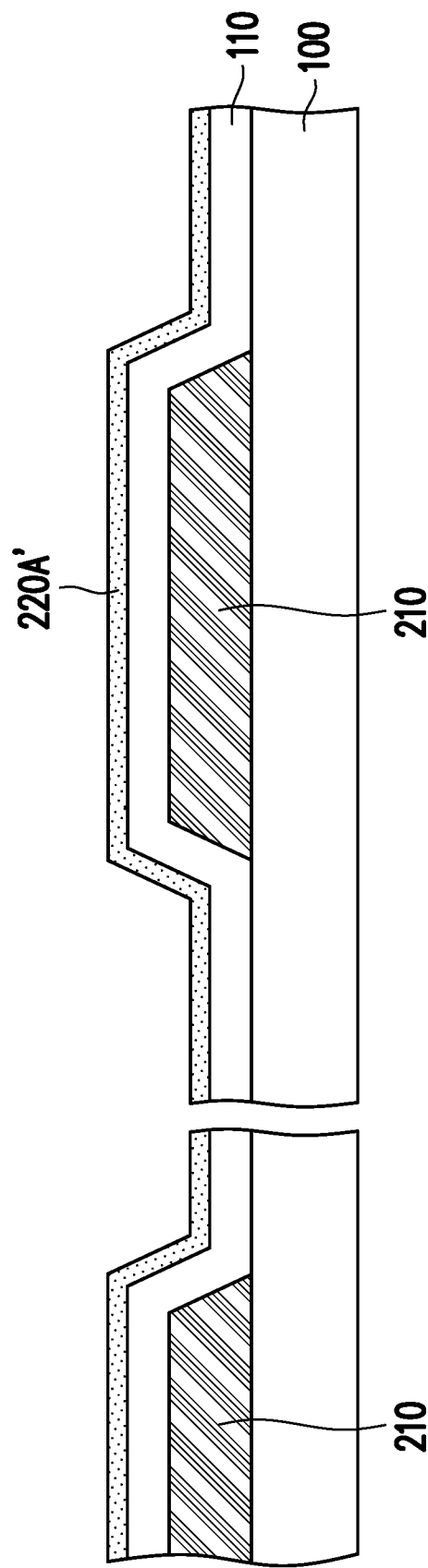

Please refer to FIG. 6A. The second gate 210 is formed on the substrate 100. The second gate dielectric layer 110 is formed on the second gate 210. The blanketed first metal oxide material layer 220A' is formed on the substrate 100 and the second gate dielectric layer 110.

Figure 6B:
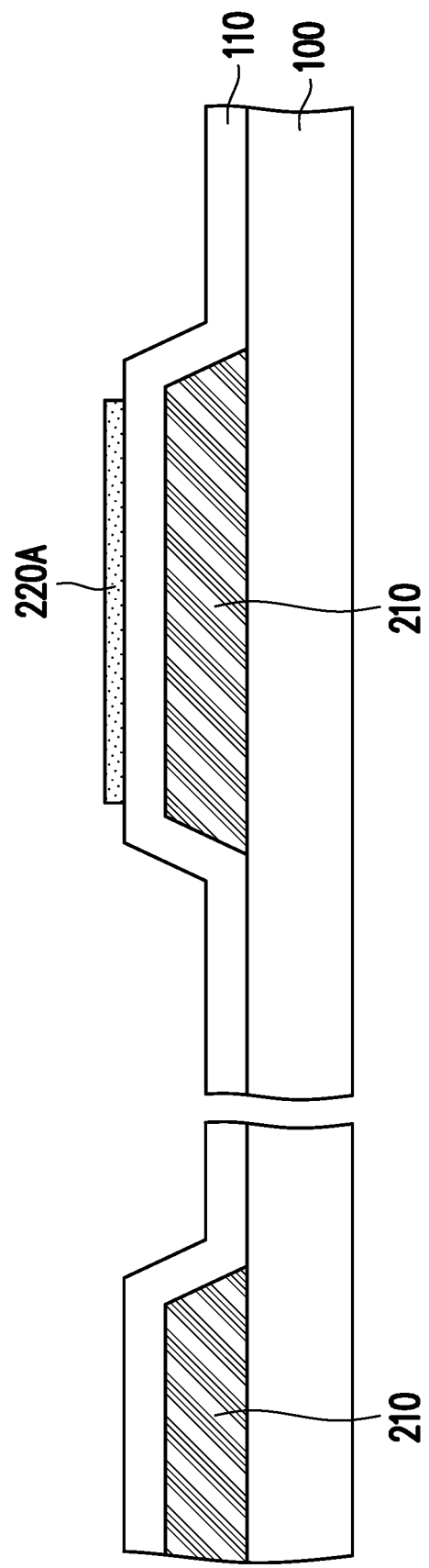

Please refer to FIG. 6B. The first metal oxide material layer 220A' is patterned to form the first metal oxide layer 220A on the second gate dielectric layer 110.

Figure 6C:
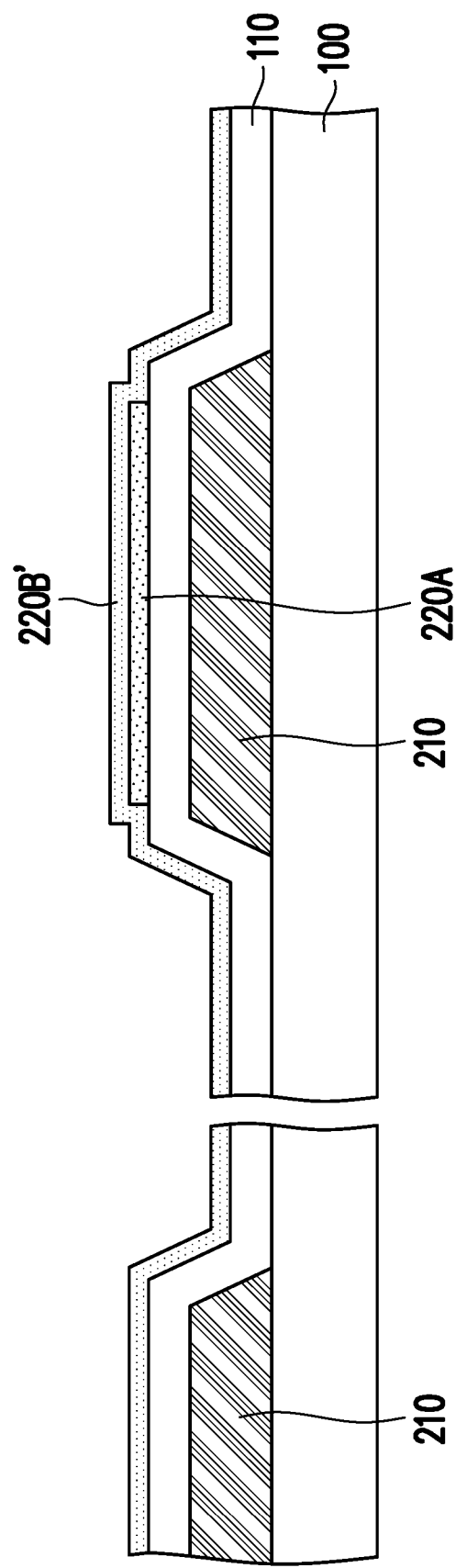
Figure 6D:
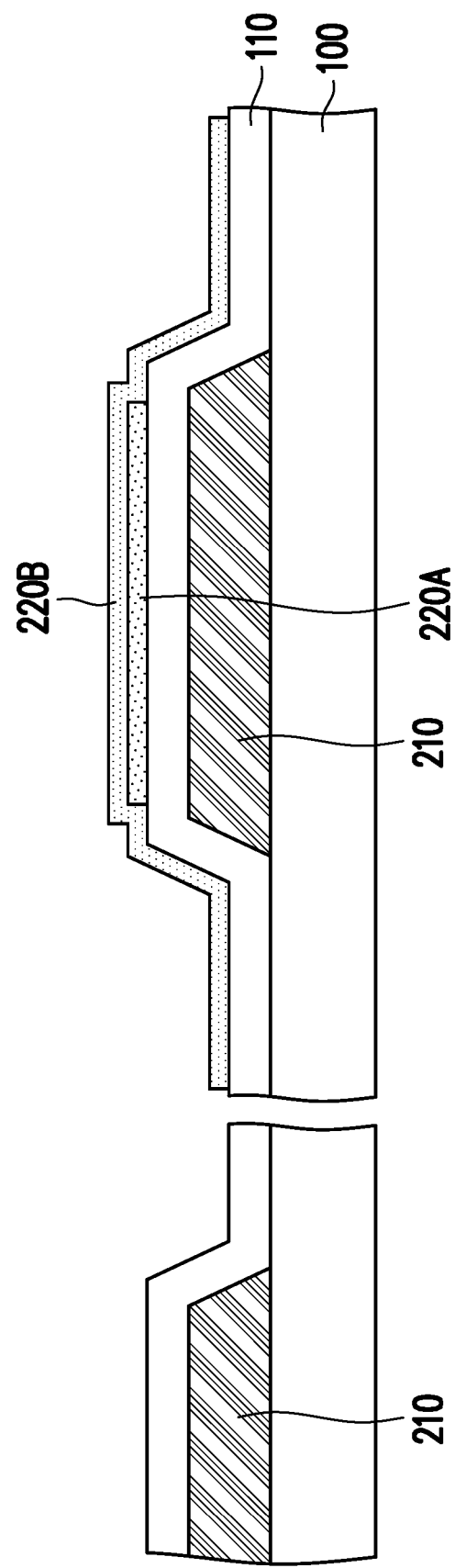

Please refer to FIG. FIG. 6C to 6D. The second metal oxide layer 220B is formed on the first metal oxide layer 220A. First, the blanketed second metal oxide material layer 220B' is formed on the substrate 100, the second gate dielectric layer 110, and the first metal oxide layer 220A. Then, the second metal oxide material layer 220B' is patterned to form the second metal oxide layer 220B.

Please refer to FIG. 6E. The first gate dielectric layer 120 is formed on the second metal oxide layer 220B. The fifth contact hole TH5 penetrating the second gate dielectric layer 110 and the first gate dielectric layer 120 is formed. The fifth contact hole TH5 exposes the second gate 210.

Please refer to FIG. 6F. The first gate 240 and the transfer electrode 320 are formed on the first gate dielectric layer 120. The first gate 240 and the transfer electrode 320 belong to the same patterned conductive layer. The first gate 240 overlaps with the first metal oxide layer 220A. The transfer electrode 320 is filled in the fifth contact hole TH5 to be electrically connected to the second gate 210. The transfer electrode 320 is formed on the second gate 210.

Using the first gate 240 as a mask, the doping process P is performed on the second metal oxide layer 220B to form the source region 222, the drain region 226, and the channel region 224 in the second metal oxide layer 220B. In some embodiments, the doping process P is, for example, a hydrogen plasma process.

Figure 6G:
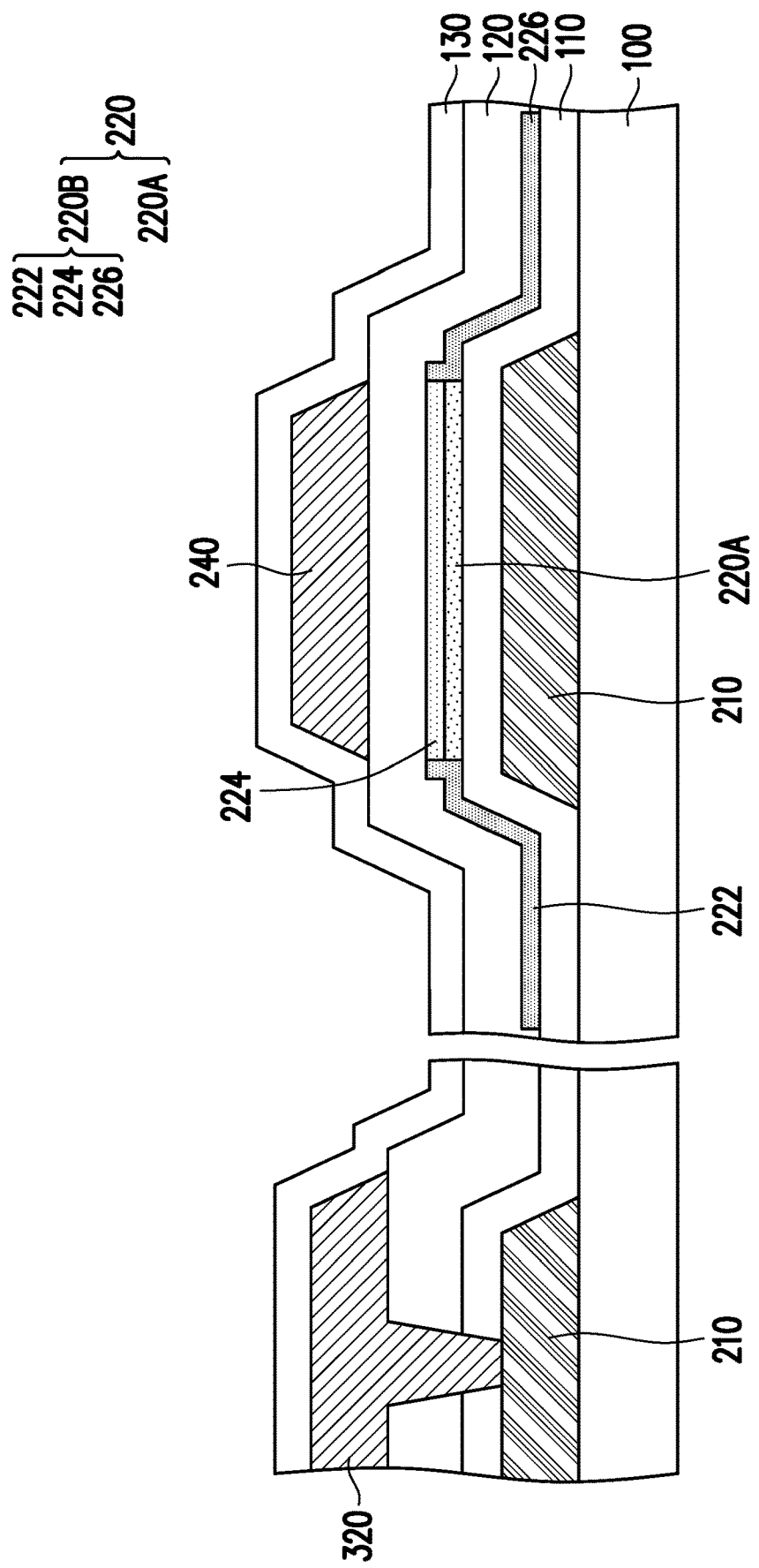

Please refer to FIG. 6G. The interlayer dielectric layer 130 is formed on the first gate 240, the first gate dielectric layer 120, and the transfer electrode 320. The interlayer dielectric layer 130 covers the first gate 240 and the transfer electrode 320.

Figure 6H:
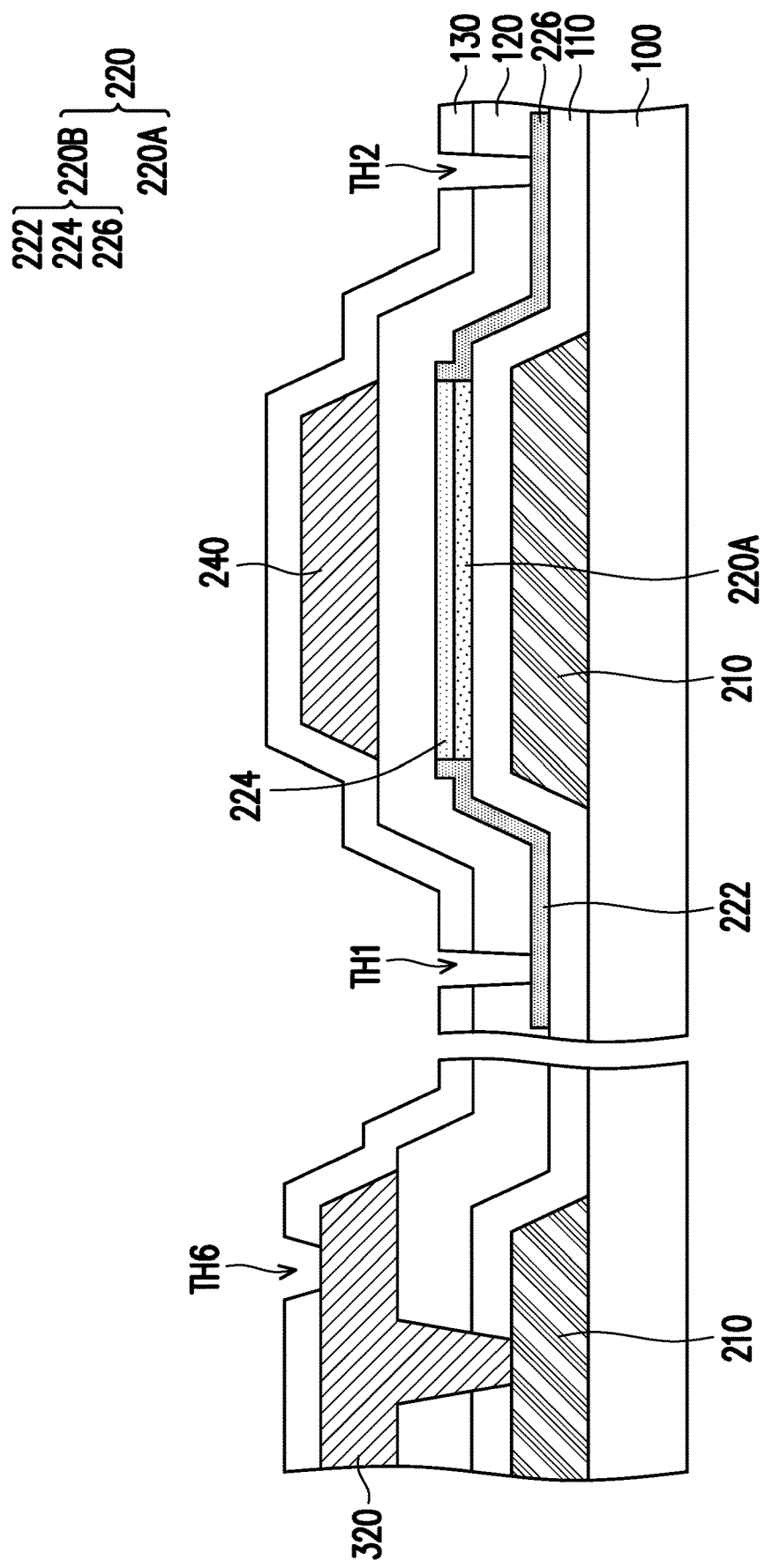

Please refer to FIG. 6H. The first contact hole TH1 and the second contact hole TH2 penetrating the interlayer dielectric layer 130 and the first gate dielectric layer 120 are formed. In some embodiments, the sixth contact hole TH6 of the interlayer dielectric layer 130 is also simultaneously formed. In some embodiments, the third contact hole (not shown in FIG. 6H) penetrating the interlayer dielectric layer 130 is also simultaneously formed.

Finally, please return to FIG. 5A and FIG. 5B. The source 232, the drain 234, and the signal line 310 are formed. The source 232, the drain 234, and the signal line 310 belong to the same patterned conductive layer. The source 232 and the drain 234 are respectively filled in the first contact hole TH1 and the second contact hole TH2 to be electrically connected to the source region 222 and the drain region 226 of the second metal oxide layer 220B. The source 232 is filled in the sixth contact hole TH6 to be electrically connected to the transfer electrode 320, and the source 232 is electrically connected to the second gate 210 through the transfer electrode 320. The signal line 310 is filled in the third contact hole TH3 to be electrically connected to the first gate 240.

Based on the above, the semiconductor structure 220 of the semiconductor device 10C includes the first metal oxide layer 220A and the second metal oxide layer 220B, and the carrier mobility of the first metal oxide layer 220A is greater than the carrier mobility of the channel region 224 of the second metal oxide layer 220B, thereby increasing the drain current of the semiconductor device 10C. In addition, since the difference between the width W1 of the first gate 240 and the width W2 of the first metal oxide layer 220A is less than 0.5 µm, the hot carrier effect caused by the electric field of the first gate 240 can be reduced, thereby improving the reliability of the semiconductor device 10C.

What is claimed is:
1. A semiconductor device, comprising:
   a substrate;
   a second gate, located on the substrate;
   a second gate dielectric layer, located on the second gate;
   a semiconductor structure, located on the substrate and comprising:
      a first metal oxide layer, located on the second gate dielectric layer; and
      a second metal oxide layer, wherein the second metal oxide layer covers a top surface and a sidewall of the first metal oxide layer, the second metal oxide layer has a stepped structure at the sidewall of the first metal oxide layer, a carrier mobility of the first metal oxide layer is greater than a carrier mobility of a channel region of the second metal oxide layer, and a thickness of the second metal oxide layer is greater than or equal to a thickness of the first metal oxide layer;

a first gate dielectric layer, located on the semiconductor structure;

a first gate, located on the first gate dielectric layer and overlapping with the first metal oxide layer, wherein a difference between a width of the first gate and a width of the first metal oxide layer is less than 0.5 µm;

a transfer electrode, located on the second gate;

an interlayer dielectric layer, located on the transfer electrode and the first gate; and a source and a drain, electrically connected to the second metal oxide layer, wherein the source and the drain are located on the interlayer dielectric layer, wherein the source is electrically connected to the second gate through the transfer electrode.

2. The semiconductor device according to claim 1, wherein an oxygen concentration of the channel region of the second metal oxide layer is greater than an oxygen concentration of the first metal oxide layer.

3. The semiconductor device according to claim 1, wherein an indium concentration of the channel region of the second metal oxide layer is less than an indium concentration of the first metal oxide layer.

4. The semiconductor device according to claim 1, wherein a thickness of the second metal oxide layer is 15 nm to 25 nm, and a thickness of the first metal oxide layer is 5 nm to 15 nm.

5. The semiconductor device according to claim 1, wherein a sidewall of the first gate and the sidewall of the first metal oxide layer overlap in a normal direction of a top surface of the substrate.

6. The semiconductor device according to claim 1, wherein a material of the second metal oxide layer is InGaZnO, and a material of the first metal oxide layer is InGaZnO or InWZnO.

7. The semiconductor device according to claim 1, wherein a horizontal distance between a sidewall of the first gate and a rise of the stepped structure of the second metal oxide layer is less than 0.5 µm.

8. The semiconductor device according to claim 1, wherein the second metal oxide layer comprises a source region, a drain region, and the channel region located between the source region and the drain region, wherein resistivities of the source region and the drain region are less than a resistivity of the channel region, and the channel region overlaps with the first metal oxide layer.

9. The semiconductor device according to claim 8, wherein the stepped structure is located in the source region and/or the drain region.

10. A manufacturing method of a semiconductor device, comprising:

forming a second gate on a substrate;

forming a second gate dielectric layer on the second gate;

forming a first metal oxide layer on the second gate dielectric layer;

forming a second metal oxide layer on the first metal oxide layer, wherein the second metal oxide layer covers a top surface and a sidewall of the first metal oxide layer, and the second metal oxide layer has a stepped structure at the sidewall of the first metal oxide layer, wherein a thickness of the second metal oxide layer is greater than or equal to a thickness of the first metal oxide layer;

forming a first gate dielectric layer on the second metal oxide layer;

forming a first gate on the first gate dielectric layer, wherein the first gate overlaps with the first metal oxide layer, wherein a difference between a width of the first gate and a width of the first metal oxide layer is less than 0.5 µm;

forming a transfer electrode on the second gate;

forming a source region, a drain region, and a channel region located between the source region and the drain region in the second metal oxide layer, wherein a carrier mobility of the first metal oxide layer is greater than a carrier mobility of the channel region of the second metal oxide layer;

forming an interlayer dielectric layer on the transfer electrode and the first gate; and forming a source and a drain on the interlayer dielectric layer, wherein the source and the drain are electrically connected to the second metal oxide layer, wherein the source is electrically connected to the second gate through the transfer electrode.

11. The manufacturing method of the semiconductor device according to claim 10, wherein a width of the second gate is greater than a width of the first metal oxide layer.

12. The manufacturing method of the semiconductor device according to claim 10, wherein using the first gate as a mask, a doping process is performed on the second metal oxide layer to form the source region, the drain region, and the channel region in the second metal oxide layer.

13. The manufacturing method of the semiconductor device according to claim 10, wherein a material of the second metal oxide layer comprises InGaZnO, and a material of the first metal oxide layer comprises InGaZnO or InWZnO.

14. The manufacturing method of the semiconductor device according to claim 10, wherein a horizontal distance between a sidewall of the first gate and a rise of the stepped structure of the second metal oxide layer is less than 0.5 µm.

15. The manufacturing method of the semiconductor device according to claim 10, wherein a thickness of the second metal oxide layer is 15 nm to 25 nm, and a thickness of the first metal oxide layer is 5 nm to 15 nm.

16. The manufacturing method of the semiconductor device according to claim 10, wherein a sidewall of the first gate is aligned with the sidewall of the first metal oxide layer.

* * * * *